(12) United States Patent
Huang

(10) Patent No.: US 11,309,214 B2
(45) Date of Patent: Apr. 19, 2022

(54) SEMICONDUCTOR DEVICE WITH GRAPHENE-BASED ELEMENT AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 18 days.

(21) Appl. No.: 16/990,808

(22) Filed: Aug. 11, 2020

(65) Prior Publication Data

US 2022/0051937 A1 Feb. 17, 2022

(51) Int. Cl.
*H01L 21/768* (2006.01)
*H01L 23/48* (2006.01)
*H01L 23/532* (2006.01)
*H01L 29/423* (2006.01)

(52) U.S. Cl.
CPC .. *H01L 21/76846* (2013.01); *H01L 21/76829* (2013.01); *H01L 23/481* (2013.01); *H01L 23/53276* (2013.01); *H01L 29/4236* (2013.01)

(58) Field of Classification Search
CPC ......... H01L 21/76829; H01L 21/76846; H01L 23/53276; H01L 23/481; H01L 29/4236
See application file for complete search history.

(56) References Cited

U.S. PATENT DOCUMENTS

| | | |
|---|---|---|
| 2011/0254082 A1 | 10/2011 | Jang |
| 2012/0281484 A1* | 11/2012 | Cho ........................ B82Y 40/00 365/185.28 |
| 2015/0214362 A1* | 7/2015 | Oh ...................... H01L 29/4236 257/330 |
| 2015/0340453 A1 | 11/2015 | Cho |
| 2016/0260813 A1* | 9/2016 | Cho ................... H01L 29/4966 |
| 2018/0286980 A1 | 10/2018 | Bi et al. |
| 2019/0259839 A1 | 8/2019 | Ryu |
| 2020/0135879 A1* | 4/2020 | Cheng ................ H01L 27/0922 |
| 2020/0219884 A1 | 7/2020 | Lee et al. |

* cited by examiner

*Primary Examiner* — Herve-Louis Y Assouman
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first substrate, a buried dielectric layer inwardly positioned in the first substrate, a buried conductive layer including a lower portion positioned on the buried dielectric layer and an upper portion positioned on the lower portion, a buried capping layer positioned on the upper portion, and buried covering layers positioned between the buried capping layer and the buried dielectric layer and between the upper portion of the buried conductive layer and the buried dielectric layer. The buried conductive layer includes graphene.

18 Claims, 25 Drawing Sheets

SEMICONDUCTOR DEVICE WITH GRAPHENE-BASED ELEMENT AND METHOD FOR FABRICATING THE SAME

TECHNICAL FIELD

The present disclosure relates to a semiconductor device and a method for fabricating the semiconductor device, and more particularly, to a semiconductor device with a graphene-based element and a method for fabricating the semiconductor device with the graphene-based element.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first substrate, a buried dielectric layer inwardly positioned in the first substrate, a buried conductive layer including a lower portion positioned on the buried dielectric layer and an upper portion positioned on the lower portion, a buried capping layer positioned on the upper portion, and buried covering layers positioned between the buried capping layer and the buried dielectric layer and between the upper portion of the buried conductive layer and the buried dielectric layer. The buried conductive layer includes graphene.

In some embodiments, the semiconductor device includes first source/drain regions attached on two sides of the buried dielectric layer and positioned in the first substrate. Bottommost points of the buried covering layers are at a vertical level lower than a vertical level of bottom surfaces of the first source/drain regions.

In some embodiments, the semiconductor device includes a buried barrier layer positioned between the buried covering layers and the buried dielectric layer and between the lower portion of the buried conductive layer and the buried dielectric layer.

In some embodiments, the buried barrier layer is formed of titanium, titanium nitride, titanium silicon nitride, tantalum, tantalum nitride, tantalum silicon nitride, or combination thereof.

In some embodiments, a thickness of the buried barrier layer is between about 10 angstroms and about 15 angstroms.

In some embodiments, thicknesses of the buried covering layers are gradually decreased toward to a bottom surface of the first substrate.

In some embodiments, the buried covering layers are formed of aluminum oxide, hafnium oxide, zirconium oxide, titanium oxide, titanium nitride, tungsten nitride, silicon nitride, or silicon oxide.

In some embodiments, a top surface of the buried conductive layer is at a vertical level higher than the vertical level of the bottom surfaces of the first source/drain regions.

In some embodiments, the buried capping layer includes a bottom layer positioned on the upper portion of the buried conductive layer and a top layer positioned on the bottom layer, and a top surface of the top layer is substantially coplanar with a top surface of the first substrate.

In some embodiments, the bottom layer of the buried capping layer is formed of an insulating material having a dielectric constant of about 4.0 or greater and the top layer of the buried capping layer is formed of silicon oxide or fluoride-doped silicate, or the like.

Another aspect of the present disclosure provides a method for fabricating a semiconductor device including providing a first substrate, forming a first trench in the first substrate, conformally forming a buried dielectric layer in the first trench, conformally forming buried covering layers to cover an upper portion of the first trench, forming a buried conductive layer on the buried dielectric layer, between the buried covering layers, and in the first trench, and forming a buried capping layer on the buried conductive layer. The buried conductive layer comprises graphene.

In some embodiments, the method for fabricating the semiconductor device further comprises a step of conformally forming a buried barrier layer on the buried dielectric layer and in the first trench.

In some embodiments, the method for fabricating the semiconductor device further comprises a step of forming first source/drain regions on two sides of the buried dielectric layer and positioned in the first substrate, wherein bottommost points of the buried covering layers are at a vertical level lower than a vertical level of bottom surfaces of the first source/drain regions.

In some embodiments, the buried barrier layer is formed between the buried covering layers and the buried dielectric layer and between the lower portion of the buried conductive layer and the buried dielectric layer.

In some embodiments, the buried barrier layer is formed of titanium, titanium nitride, titanium silicon nitride, tantalum, tantalum nitride, tantalum silicon nitride, or combination thereof.

In some embodiments, a thickness of the buried barrier layer is between about 10 angstroms and about 15 angstroms.

In some embodiments, the thicknesses of the buried covering layers are gradually decreased toward to a bottom surface of the first substrate.

In some embodiments, the buried covering layers are formed of aluminum oxide, hafnium oxide, zirconium oxide, titanium oxide, titanium nitride, tungsten nitride, silicon nitride, or silicon oxide.

In some embodiments, a top surface of the buried conductive layer is at a vertical level higher than the vertical level of the bottom surfaces of the first source/drain regions.

In some embodiments, the buried capping layer comprises a bottom layer positioned on the upper portion of the buried conductive layer and a top layer positioned on the bottom layer, and a top surface of the top layer is substantially coplanar with a top surface of the first substrate.

Due to the design of the semiconductor device of the present disclosure, the overall cross-sectional area of the buried conductive layer may be increased by the upper portion of the buried conductive layer. Combining with the good conductivity of the buried conductive layer including graphene, the conductivity and performance of the semiconductor device may be improved. In addition, the presence of the buried covering layers may prevent void formation during fabrication of the semiconductor device. Therefore, the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
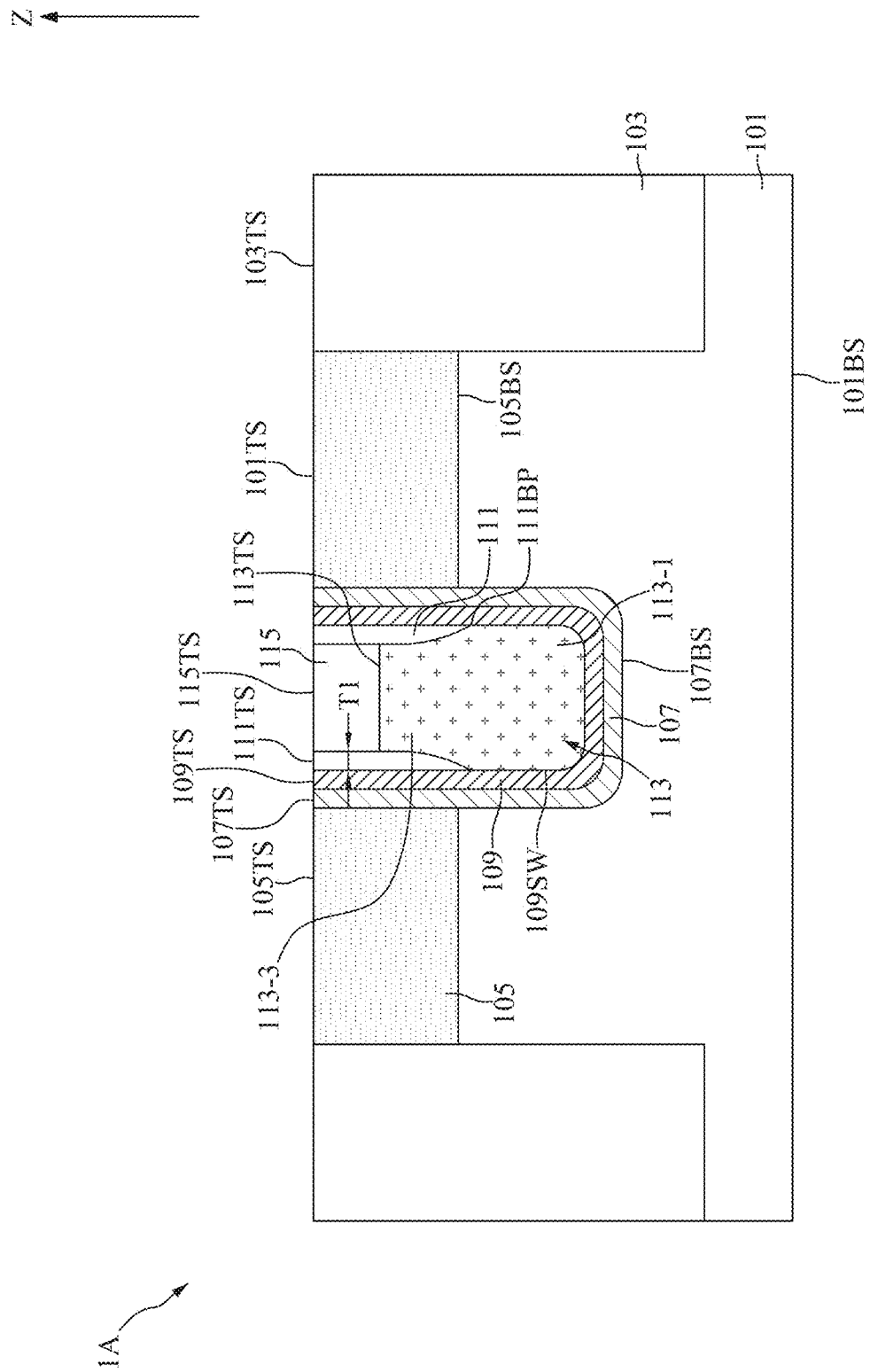
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

FIG. 1 illustrates, in a schematic cross-sectional view diagram, a semiconductor device 1A in accordance with one embodiment of the present disclosure.

With reference to FIG. 1, the semiconductor device 1A may include a first substrate 101, first isolation layers 103, first source/drain regions 105, a buried dielectric layer 107, a buried barrier layer 109, buried covering layers 111, a buried conductive layer 113, and a buried capping layer 115.

With reference to FIG. 1, the first substrate 101 may be formed of, for example, silicon, germanium, silicon germanium, silicon carbide, silicon germanium carbon, gallium, gallium arsenide, indium arsenide, indium phosphorus or other IV-IV, III-V or II-VI semiconductor materials. In some embodiments, the first substrate 101 may include an organic semiconductor or a layered semiconductor such as silicon/silicon germanium, silicon-on-insulator or silicon germanium-on-insulator. When the first substrate 101 is formed of silicon-on-insulator, the first substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIG. 1, the first isolation layers 103 may be disposed in the first substrate 101. The top surfaces 103TS of the first isolation layers 103 may be substantially coplanar with the top surface 101TS of the first substrate 101. The first isolation layers 103 may be formed of, for example, an insulating material such as silicon oxide, silicon nitride, silicon oxynitride, silicon nitride oxide, or fluoride-doped silicate. In some embodiments, the sidewalls of the first isolation layers 103 may have slanted cross-sectional profiles. In some embodiments, widths of the first isolation layers 103 may gradually become wider from bottom to top along the direction Z. In some embodiments, the first isolation layers 103 as a whole may have a uniform slope. In some embodiments, the aspect ratio of the first isolation layers 103 may be between about 1:6 and 1:10.

With reference to FIG. 1, the buried dielectric layer 107 may be inwardly positioned in the first substrate 101. The top surface 107TS may be substantially coplanar with the top surface 101TS of the first substrate 101. In some embodiments, the buried dielectric layer 107 may have an U-shaped cross-sectional profile. In some embodiments, the bottom surface 107BS of the buried dielectric layer 107 may be rounded to reduce defect density and reduce electric field concentration during the operating of the semiconductor device 1A. In some embodiments, the bottom surface 107BS of the buried dielectric layer 107 may be flat. The buried dielectric layer 107 may prevent junction leakage and prevent dopants in the first source/drain regions 105 from migrating into the buried conductive layer 113.

In some embodiments, the buried dielectric layer 107 may be formed of, for example, silicon oxide. In some embodiments, the buried dielectric layer 107 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the buried dielectric layer 107 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the buried dielectric layer 107 may be a multilayer structure that includes, for example, one layer of silicon oxide and another layer of high-k dielectric material.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, the first source/drain regions 105 may be disposed on two sides of the buried dielectric layer 107 and in the first substrate 101. The top surfaces 105TS of the first source/drain regions 105 may be substantially coplanar with the top surface 101TS of the first substrate 101. The first source/drain regions 105 may be doped with n-type dopants or p-type dopant. The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. The term "p-type dopant" refers to an impurity that when added to an intrinsic semiconductor material creates to deficiencies of valence electrons. In a silicon containing semiconductor material, examples of p-type dopants include, but are not limited to, boron, aluminum, gallium and/or indium. In some embodiments, the concentration of dopants within the first source/drain regions 105 may be between about $4\times10^{20}$ atoms/cm$^3$ and about $2\times10^{21}$ atoms/cm$^3$; although other dopant concentrations that are lesser than, or greater than, the aforementioned range may also be employed in the present disclosure.

With reference to FIG. 1, the buried barrier layer 109 may be disposed on the buried dielectric layer 107 and in the first substrate 101. The buried barrier layer 109 may have an U-shaped cross-sectional profile. In some embodiments, the buried barrier layer 109 may have a thickness between about 10 angstroms and about 15 angstroms. In some embodiments, the buried barrier layer 109 may have a thickness between about 11 angstroms and about 13 angstroms. The buried barrier layer 109 may be formed of, for example, titanium, titanium nitride, titanium silicon nitride, tantalum, tantalum nitride, tantalum silicon nitride, or combination thereof. The buried barrier layer 109 may be employed to prevent the buried conductive layer 113 from flaking or spalling from the buried dielectric layer 107.

With reference to FIG. 1, the buried covering layers 111 may be respectively correspondingly disposed on the upper portions of the sidewalls 109SW of the buried barrier layer 109. The top surfaces 111TS of the buried covering layers 111 may be substantially coplanar with the top surface 101TS of the first substrate 101. Thicknesses T1 of the buried covering layers 111 may be gradually decreased toward the bottom surface 101BS of the first substrate 101. Bottommost points 111BP of the buried covering layers 111 may be at a vertical level lower than a vertical level of the bottom surfaces 105BS of the first source/drain regions 105. In some embodiments, the buried covering layers 111 may be formed of, for example, aluminum oxide, hafnium oxide, zirconium oxide, titanium oxide, titanium nitride, tungsten nitride, silicon nitride, or silicon oxide. The buried covering layers 111 may provide additional electrically isolation to insulate the first source/drain regions 105 and the buried conductive layer 113. In addition, with the presence of the buried covering layers 111, the buried conductive layer 113 can be formed without any void. As a result, the reliability of the semiconductor device 1A may be improved.

With reference to FIG. 1, the buried conductive layer 113 may be disposed on the buried barrier layer 109 and in the first substrate 101. The top surface 113TS of the buried conductive layer 113 may be at a vertical level higher than the vertical level of the bottom surface 105BS of the first source/drain regions 105. The top surface 113TS of the buried conductive layer 113 may be at a vertical level lower than the vertical level of the top surface 101TS of the first substrate 101. Specifically, the buried conductive layer 113 may include a lower portion 113-1 and an upper portion 113-3. The lower portion 113-1 of the buried conductive layer 113 may be disposed on the buried barrier layer 109 and disposed below the vertical level of the bottommost points 111BP of the buried covering layers 111. The upper portion 113-3 of the buried conductive layer 113 may be disposed on the lower portion 113-1 of the buried conductive layer 113 and disposed between the buried covering layers 111.

In some embodiments, the buried conductive layer 113 may be formed of, for example, graphene. In some embodiments, the buried conductive layer 113 may be formed of, for example, graphene, graphite, or the like. In some embodiments, the buried conductive layer 113 may be formed of, for example, a material including $sp^2$ hybridized carbon atoms. In some embodiments, the buried conductive layer 113 may be formed of, for example, a material including carbons having hexagonal crystal structures. The buried conductive layer 113 formed of graphene may have low sheet resistance. In addition, the upper portion 113-3 of the buried conductive layer 113 may increase the overall cross-sectional area of the buried conductive layer 113. As a result, the conductivity of the semiconductor device 1A including the buried conductive layer 113 may be improved.

With reference to FIG. 1, the buried capping layer 115 may be disposed on the upper portion 113-3 of the buried conductive layer 113. The buried capping layer 115 may be disposed between the buried covering layers 111 and in the first substrate 101. The top surface 115TS of the buried capping layer 115 may be substantially coplanar with the top surface 101TS of the first substrate 101. The buried capping layer 115 may be formed of, for example, silicon oxide, silicon nitride, silicon oxynitride, silicon nitride oxide, other semiconductor oxides, other semiconductor nitrides, other suitable materials, or combinations thereof.

The buried dielectric layer 107, the buried conductive layer 113, and the buried capping layer 115 may together form a buried gate structure.

Figure 2:
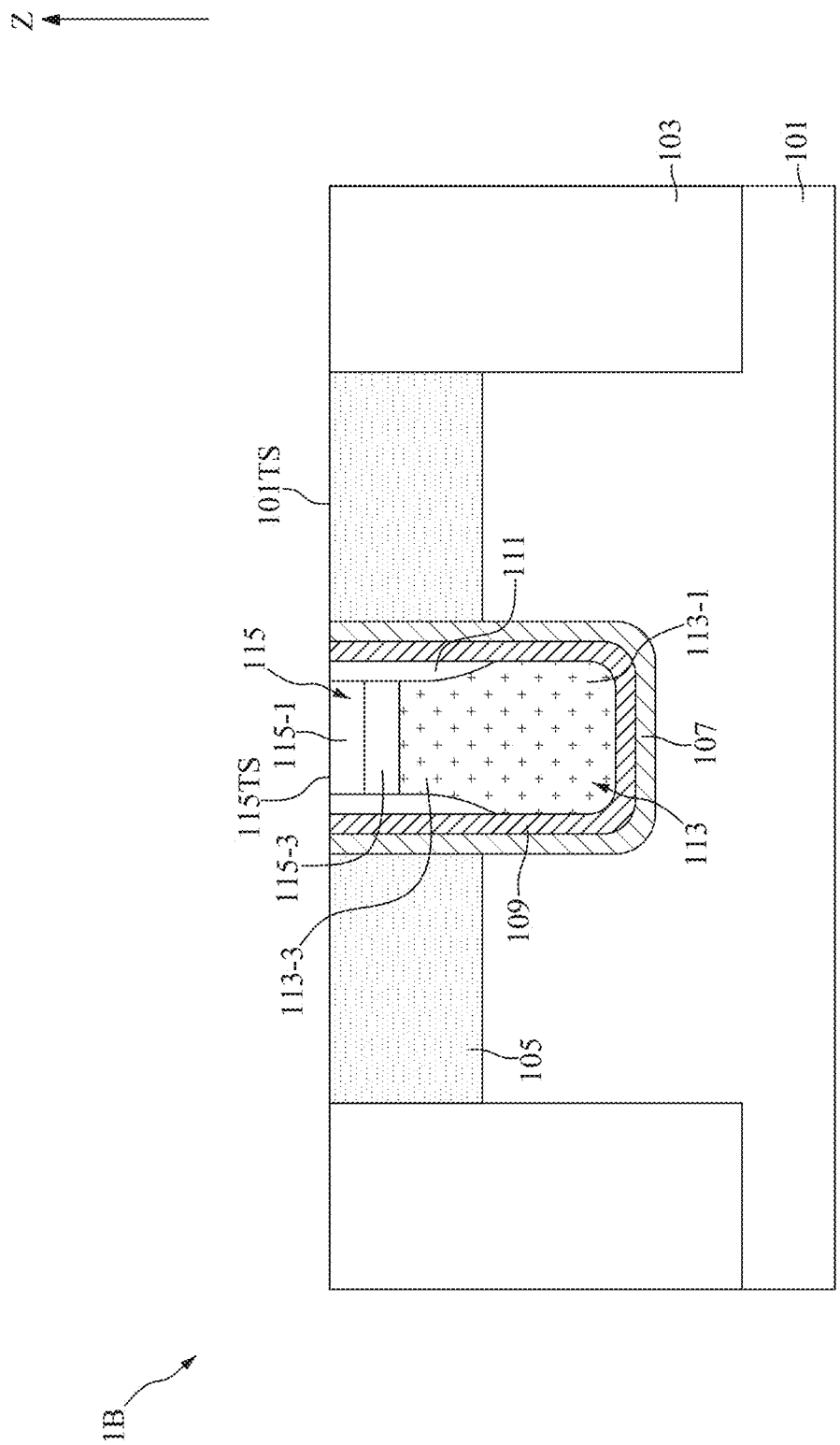
FIG. 2 illustrates, in a schematic cross-sectional view diagram, a semiconductor device in accordance with another embodiment of the present disclosure.

FIG. 2 illustrates, in a schematic cross-sectional view diagram, a semiconductor device 1B in accordance with another embodiment of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the buried capping layer 115 may include a bottom layer 115-1 and a top layer 115-3. The bottom layer 115-1 of the buried capping layer 115 may be disposed on the upper portion 113-3 of the buried conductive layer 113. The top layer 115-3 of the buried capping layer 115 may be disposed on the bottom layer 115-1 of the buried capping layer 115. The top surface of the top layer 115-3 of the buried capping layer 115 may be referred to as the top surface 115TS of the buried capping layer 115. The top surface of the top layer 115-3 of the buried capping layer 115 may be substantially coplanar with the top surface 101TS of the first substrate 101.

The bottom layer 115-1 of the buried capping layer 115 may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. The top layer 115-3 of the buried capping layer 115 may be formed of a low dielectric-constant material such as silicon oxide or fluoride-doped silicate, or the like. The top layer 115-3 of the buried capping layer 115 formed of the low dielectric-constant material may reduce electric field at the top surface of the first substrate 101; therefore, leakage current may be reduced.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 3:
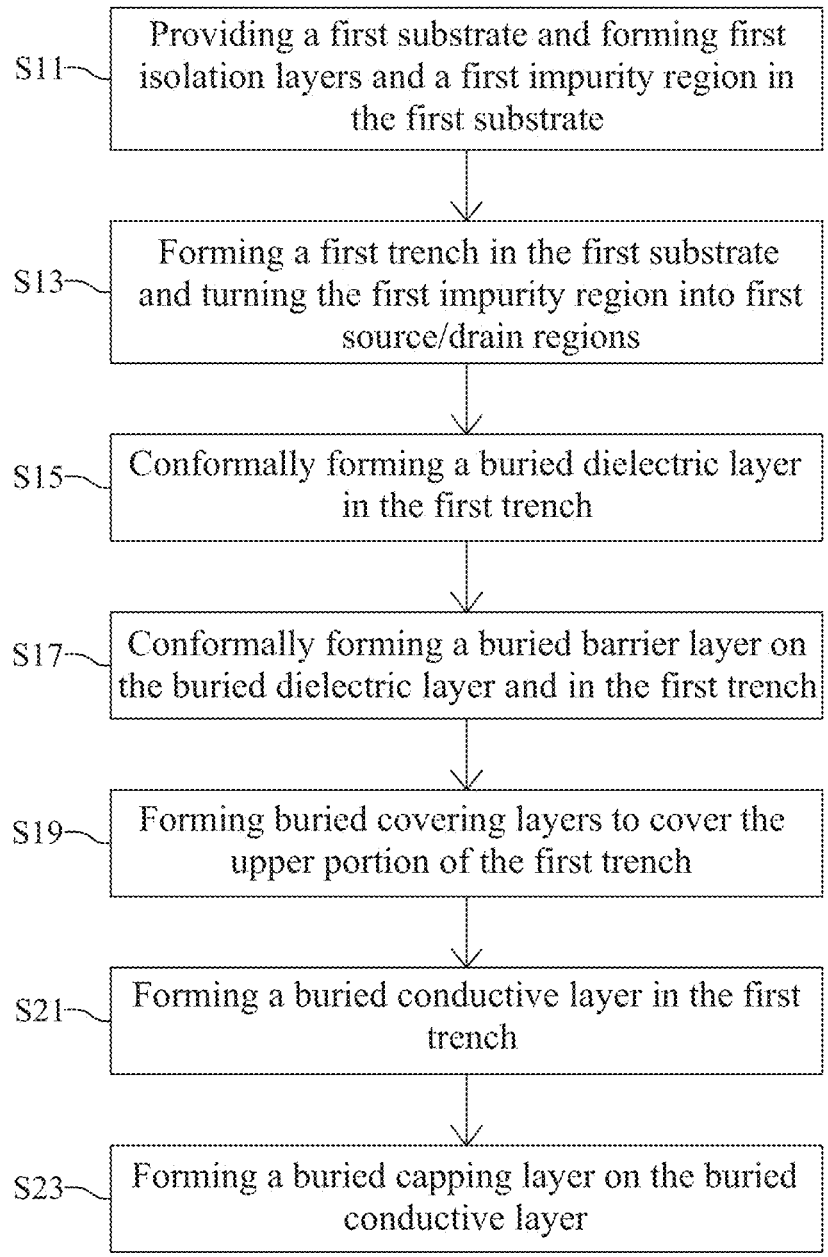
FIG. 3 illustrates, in a flowchart diagram form, a method for fabricating a semiconductor device in accordance with one embodiment of the present disclosure.

FIG. 3 illustrates, in a flowchart diagram form, a method 10 for fabricating a semiconductor device 1A in accordance with one embodiment of the present disclosure. FIGS. 4 to 10 illustrate, in schematic cross-sectional view diagrams, a flow for fabricating the semiconductor device 1A in accordance with one embodiment of the present disclosure.

Figure 4:
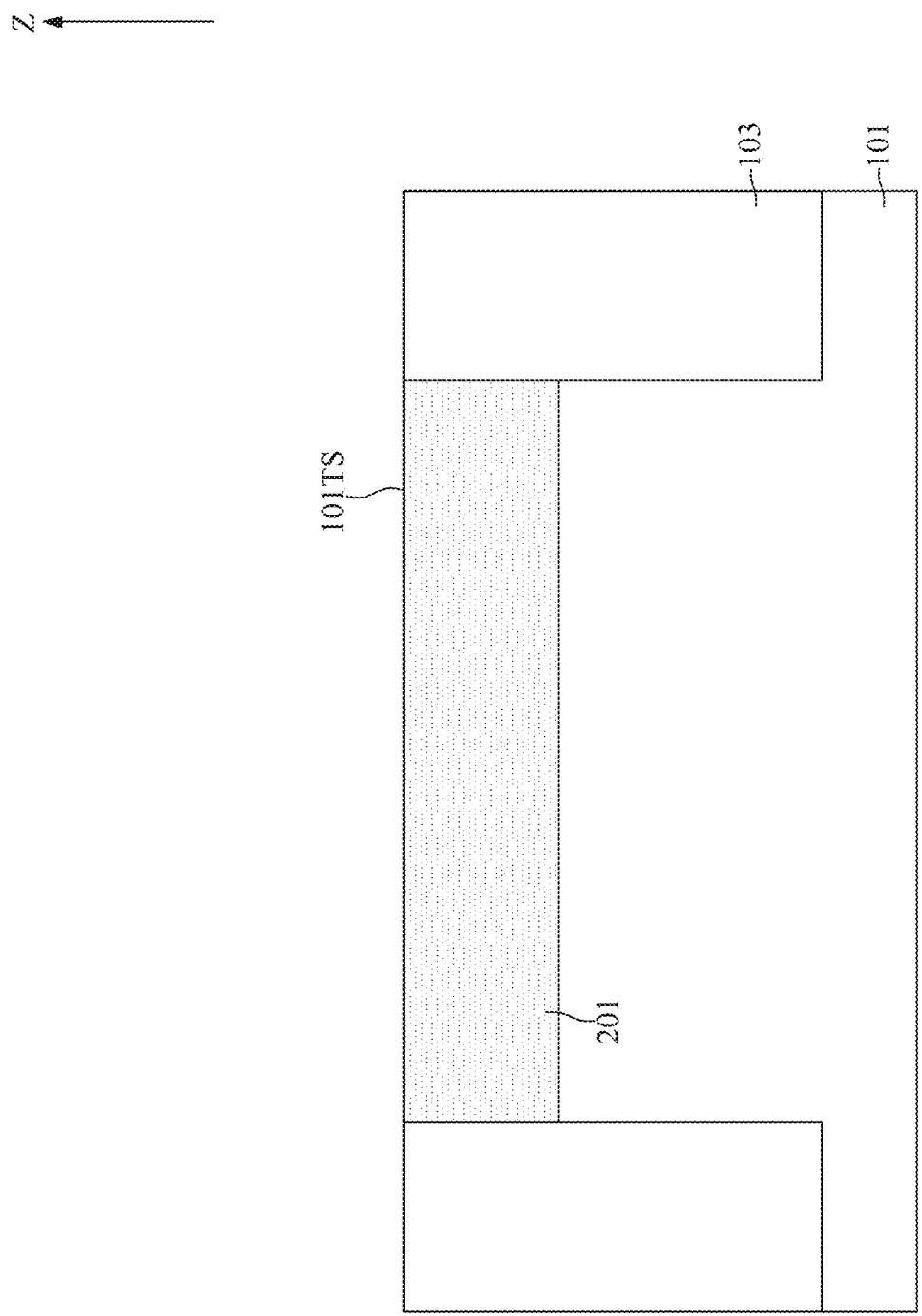
FIGS. 4 to 10 illustrate, in schematic cross-sectional view diagrams, a flow for fabricating the semiconductor device in accordance with one embodiment of the present disclosure.

With reference to FIGS. 3 and 4, at step S11, a first substrate 101 may be provided, first isolation layers 103 and a first impurity region 201 may be formed in the first substrate 101.

With reference to FIG. 4, a series of deposition processes may be performed to deposit a pad oxide layer (not shown in FIG. 4) and a pad nitride layer (not shown in FIG. 4) on the first substrate 101. A photolithography process may be performed to define positions of the first isolation layers 103. After the photolithography process, an etch process, such as an anisotropic dry etch process, may be performed to form trenches along the pad oxide layer, the pad nitride layer, and the upper portion of the first substrate 101. An insulating material, such as silicon oxide, silicon nitride, silicon oxynitride, silicon nitride oxide, or fluoride-doped silicate, may be deposited into the trenches. A planarization process, such as chemical mechanical polishing, may be subsequently performed until the top surface 101TS of the first substrate 101 is exposed to remove excess filling material. After the planarization process, the first isolation layers 103 may be formed in the first substrate 101.

With reference to FIG. 4, the first impurity region 201 may be formed by a doping process such as an implanting process using dopant such as phosphorus, arsenic, antimony, or boron. In some embodiments, the concentration of dopants within the first impurity region 201 may be between about $4\times10^{20}$ atoms/cm$^3$ and about $2\times10^{21}$ atoms/cm$^3$.

Figure 5:
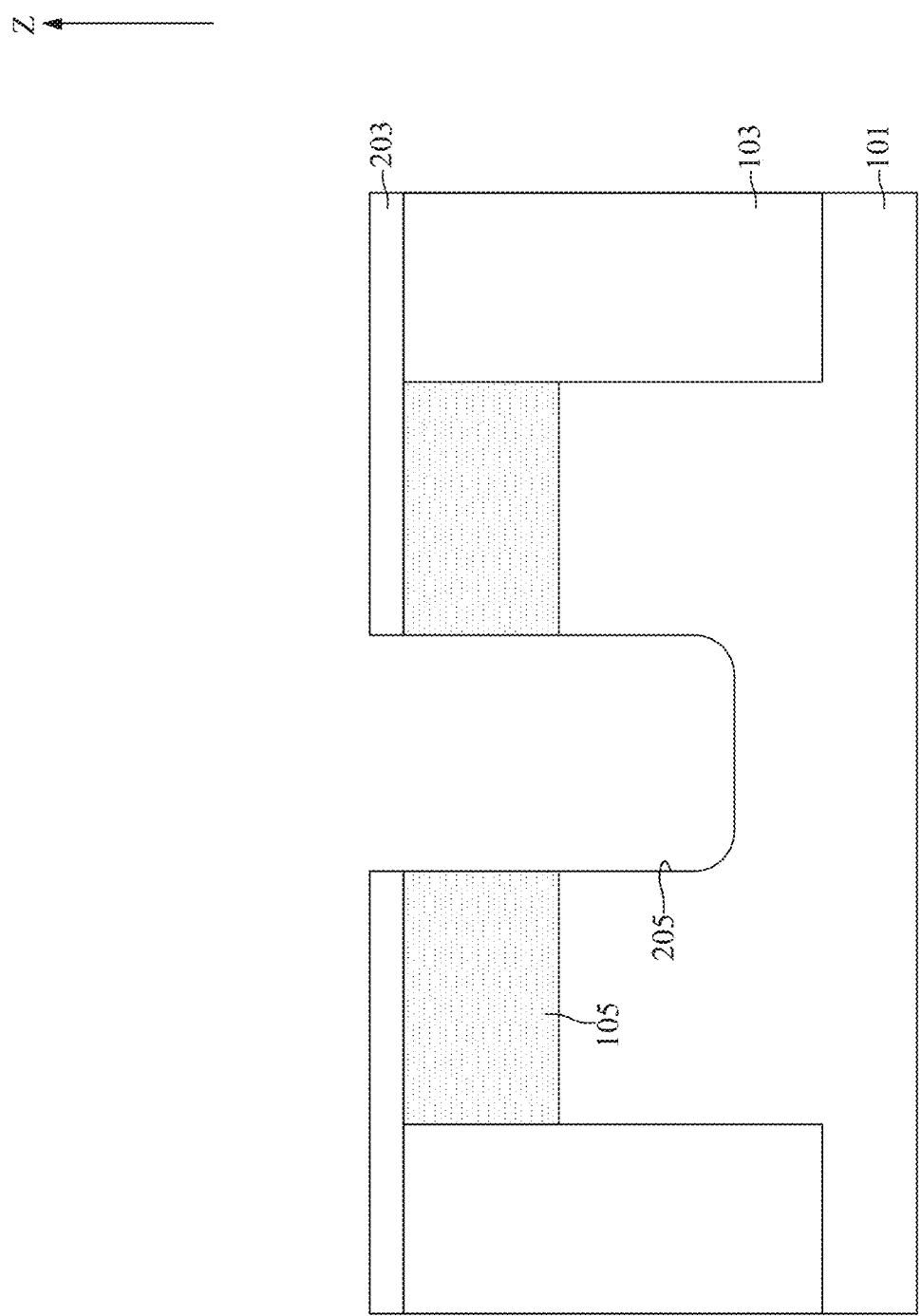

With reference to FIGS. 3 and 5, at step S13, a first trench 205 may be formed in the first substrate 101 and the first impurity region 201 may be turned into first source/drain regions 105 by the first trench 205.

With reference to FIG. 5, a first hard mask layer 203 may be formed on the first substrate 101. The first hard mask layer 203 may be formed of, for example, silicon nitride or the like. The first trench 205 may be formed along the first hard mask layer 203, the first impurity region 201, and the upper portion of the first substrate 101. The first impurity region 201 may be separated into the first source/drain regions 105 by the first trench 205. In some embodiments, bottom edge of the first trench 205 may have a curvature to facilitate the filling procedures in subsequent semiconductor processes.

Figure 6:
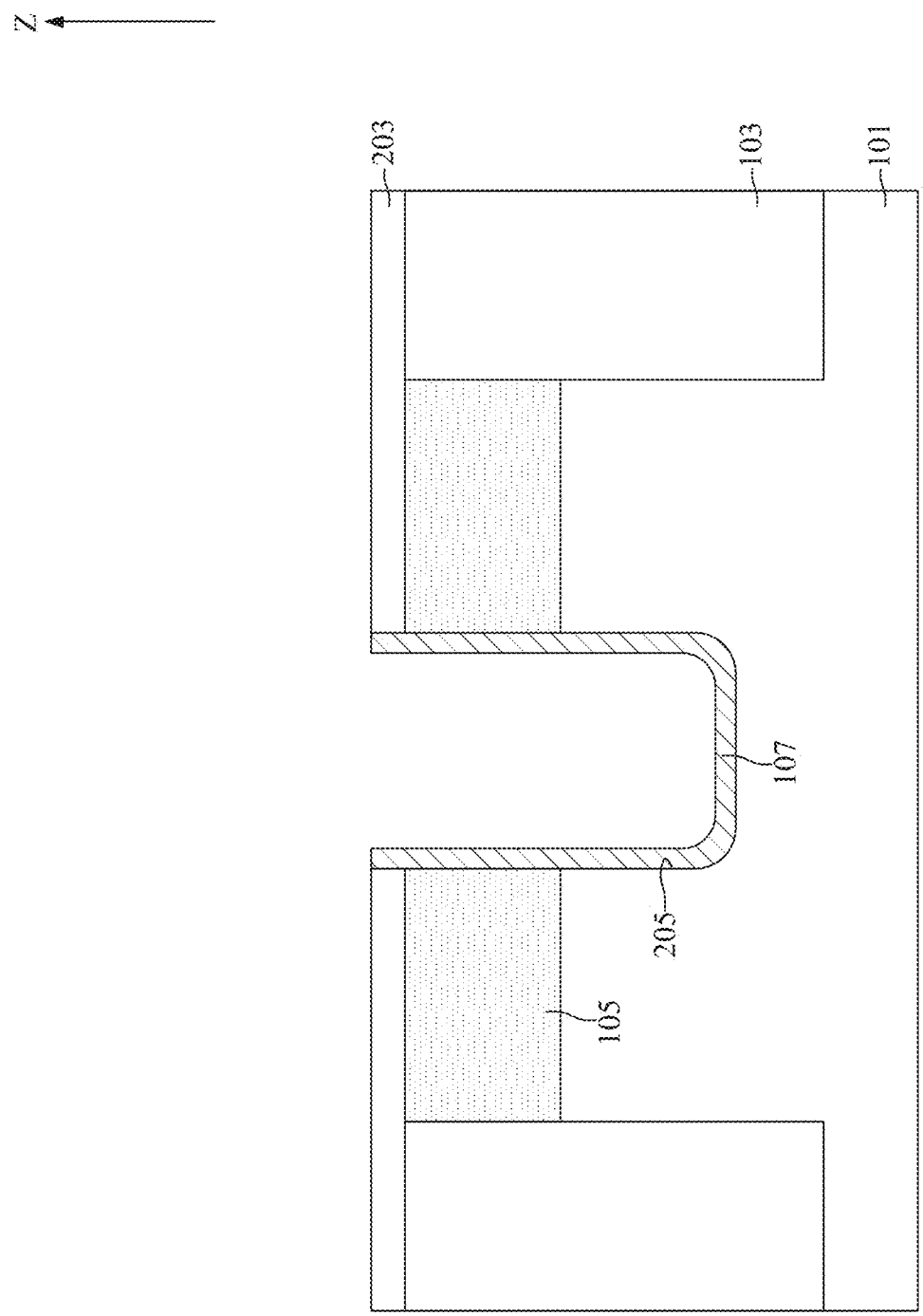

With reference to FIGS. 3 and 6, at step S15, a buried dielectric layer 107 may be conformally formed in the first trench 205.

With reference to FIG. 6, in some embodiments, the buried dielectric layer 107 may be formed by a thermal oxidation process. For example, the buried dielectric layer 107 may be formed by oxidizing the bottom and sidewalls of the first trench 205. In some embodiments, the buried dielectric layer 107 may be formed by a deposition process such as chemical vapor deposition or atomic layer deposition. In some embodiments, after a liner polysilicon layer is deposited, the buried dielectric layer 107 may be formed by radical-oxidizing the liner polysilicon layer. In some embodiments, after a liner silicon nitride layer is formed, the buried dielectric layer 107 may be formed by radical-oxidizing the liner silicon nitride layer.

Figure 7:
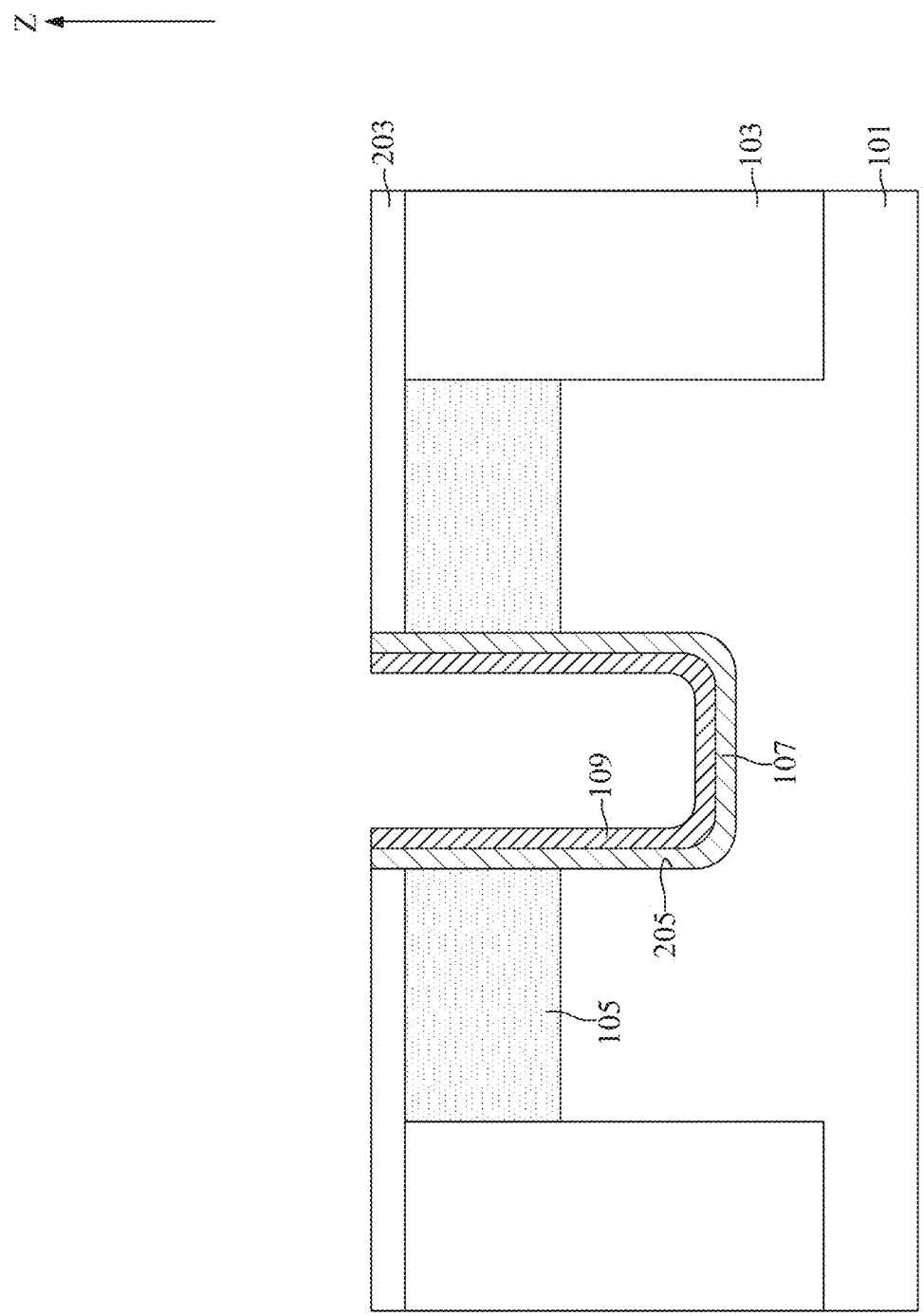

With reference to FIGS. 3 and 7, at step S17, a buried barrier layer 109 may be conformally formed on the buried dielectric layer 107 and in the first trench 205.

With reference to FIG. 7, the buried barrier layer 109 may be formed by a deposition process such as chemical vapor deposition, physical vapor deposition, sputtering, or atomic layer deposition.

Figure 8:
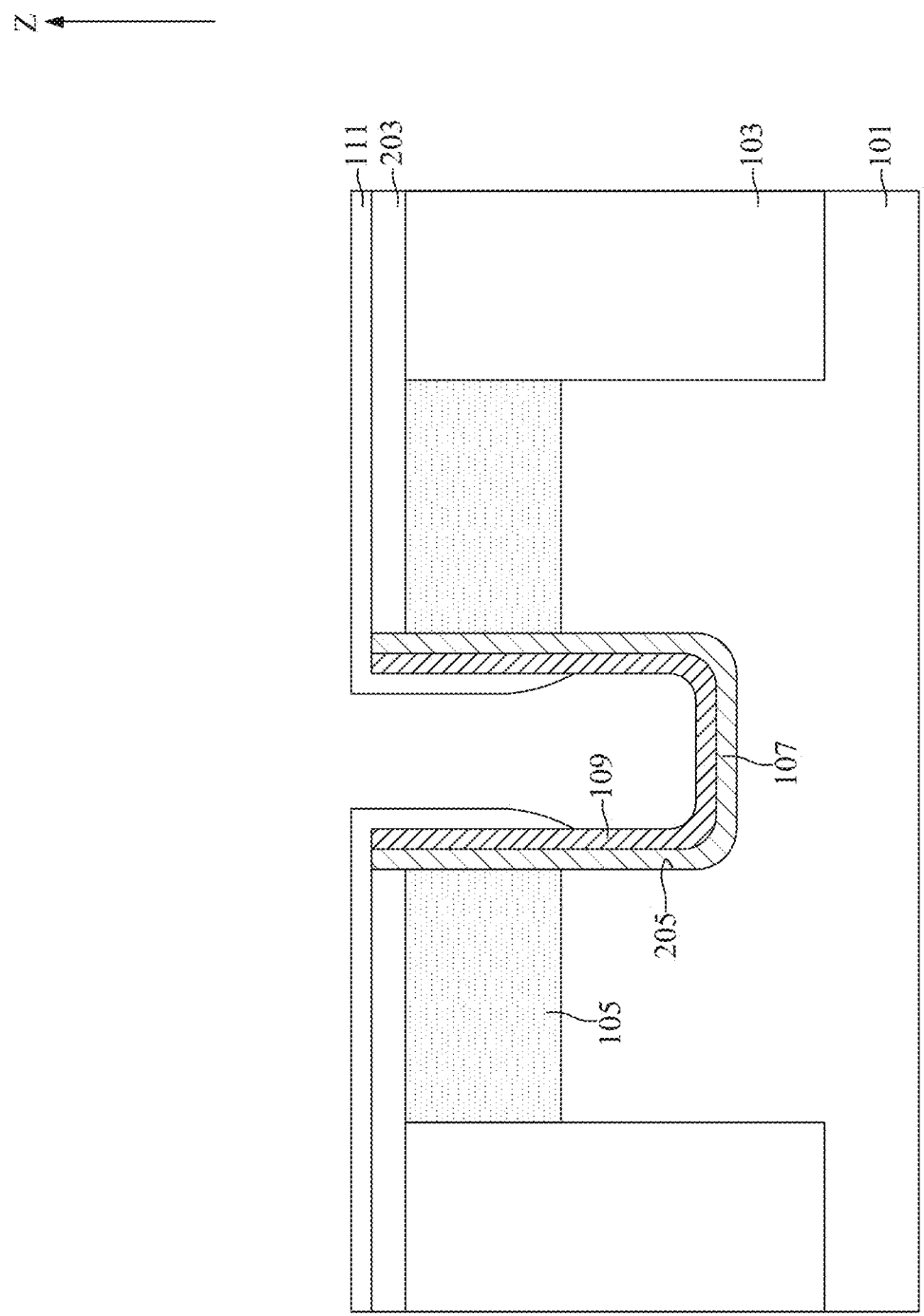

With reference to FIGS. 3 and 8, at step S19, buried covering layers 111 may be formed to cover the upper portion of the first trench 205.

With reference to FIG. 8, the buried covering layers 111 may be formed covering the upper portion of the sidewalls of the buried barrier layer 109, the top surfaces of the buried dielectric layer 107, and the top surface of the first hard mask layer 203. In some embodiments, the buried covering layers 111 may be formed by a deposition process such as an atomic layer deposition method precisely controlling an amount of a first precursor of the atomic layer deposition method. The buried covering layers 111 may be formed of, for example, aluminum oxide, hafnium oxide, zirconium oxide, titanium oxide, titanium nitride, tungsten nitride, silicon nitride, or silicon oxide.

The first precursor of the atomic layer deposition method may include trimethylaluminum, hafnium tetrachloride, hafnium tert-butoxide, hafnium dimethylamide, hafnium ethylmethylamide, hafnium diethylamide, hafnium methoxy-t-butoxide, zirconium tetrachloride, titanium tetrachloride, tetraethyl titanate, titanium isopropoxide, tungsten hexafluoride, silylene, chlorine, ammonia, dinitrogen tetrahydride, silicon tetraisocyanate, $CH_3OSi(NCO)_3$ or a combination thereof. The second precursor of the atomic layer deposition method may include water, ozone, hydrogen, or a combination thereof.

Figure 9:
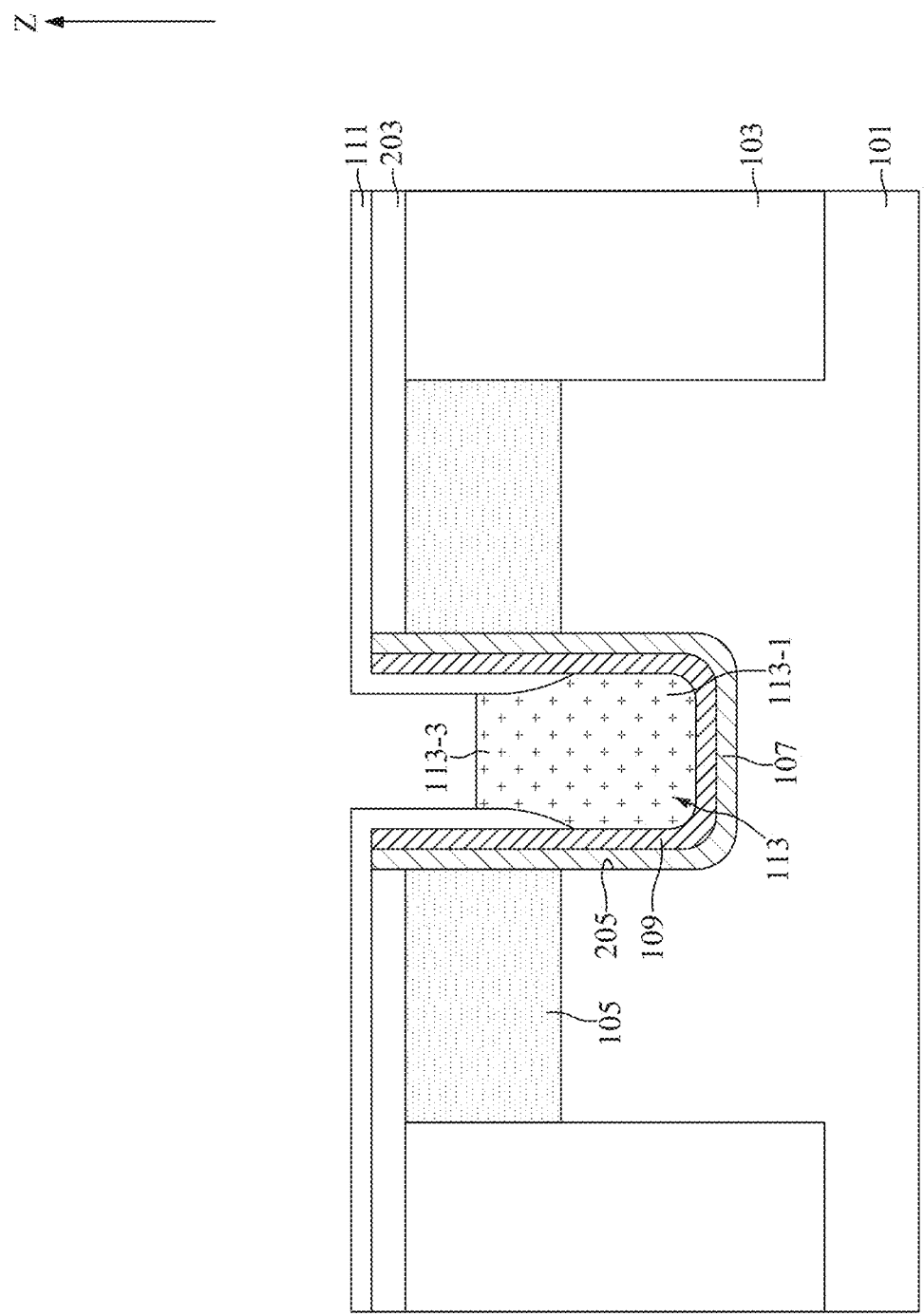

With reference to FIGS. 3 and 9, at step S21, a buried conductive layer 113 may be formed in the first trench 205.

With reference to FIG. 9, the lower portion 113-1 of the buried conductive layer 113 may be formed on the buried barrier layer 109 and in the first trench 205. The upper portion 113-3 of the buried conductive layer 113 may be formed between the buried covering layers 111 and in the first trench 205.

In some embodiments, the buried conductive layer 113 may be formed on a catalyst substrate and then transfer onto the intermediate semiconductor device illustrated in FIG. 8. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the buried conductive layer 113 may be formed with assistances of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, the buried conductive layer 113 may be formed to completely fill the first trench 205 and cover the buried covering layers 111. An etch back process may be subsequently performed to recess the top surface of the buried conductive layer 113 to a vertical level lower than the vertical level of the top surface of the first substrate 101. In some embodiments, the buried conductive layer 113 may be formed by deposition process such as atomic layer deposition or chemical vapor deposition. Due to the presence of the buried covering layers 111, the deposition rate of the buried conductive layer 113 on the sidewalls of the first trench 205 may be reduced. Hence, the deposition rate of the buried conductive layer 113 on the sidewalls of the first trench 205 and the deposition rate of the buried conductive layer 113 on the bottom surface of the first trench 205 may become close to each other. As a result, the first trench 205 may be filled without any void formation near the bottom surface of the first trench 205.

Figure 10:
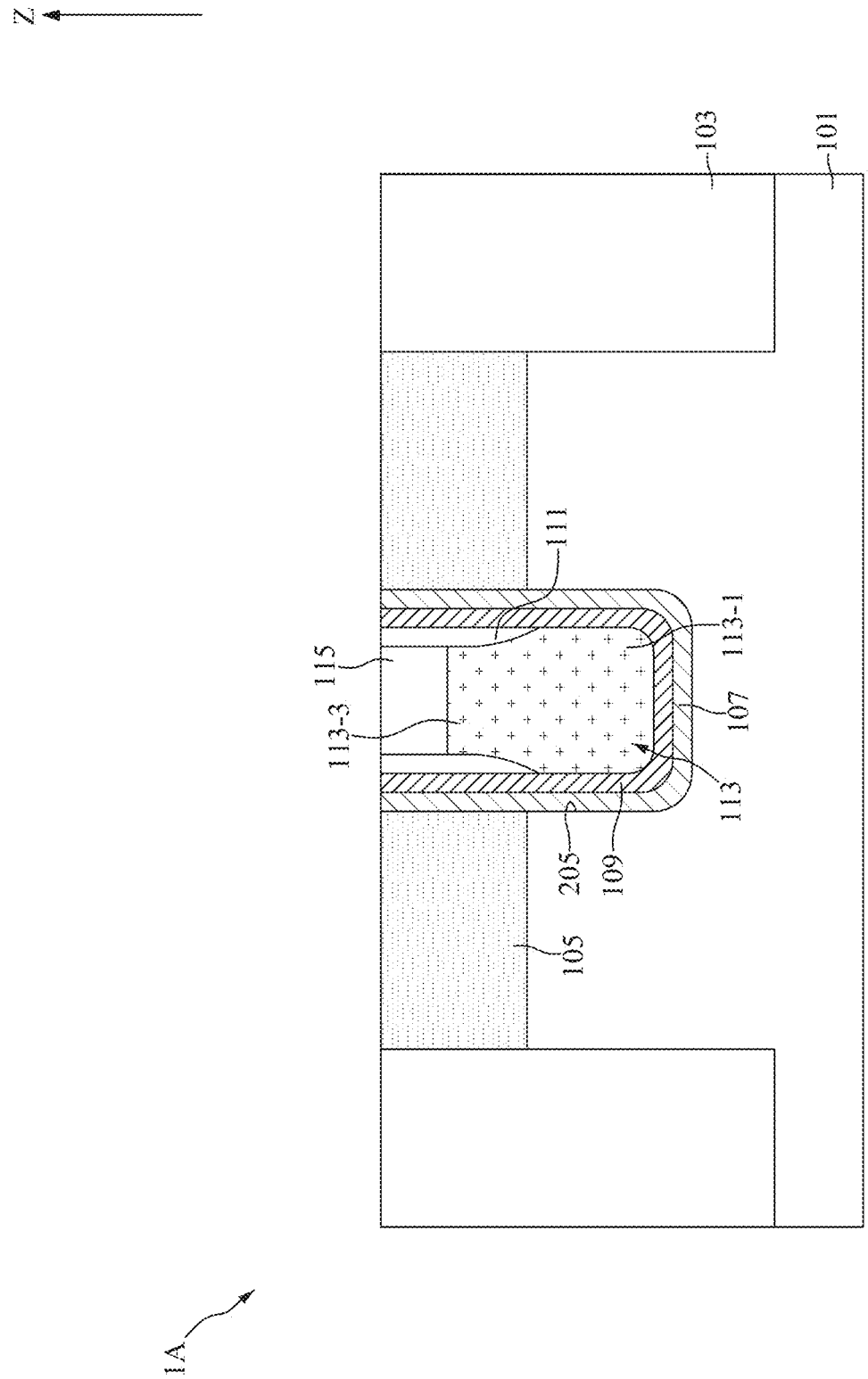

With reference to FIGS. 3 and 10, at step S23, a buried capping layer 115 may be formed on the buried conductive layer 113.

With reference to FIG. 10, a layer of insulating material may be deposited over the intermediate semiconductor device illustrated in FIG. 9 to completely fill the first trench 205 and cover the buried covering layers 111. A planarization process, such as chemical mechanical polishing, may be performed until the top surface of the first substrate 101 is exposed to remove excess material, provide a substantially flat surface for subsequent processing steps, and concurrently form the buried capping layer 115. The insulating material may be silicon oxide, silicon nitride, silicon oxynitride, silicon nitride oxide, other semiconductor oxides, other semiconductor nitrides, other suitable materials, or combinations thereof.

Figure 11:
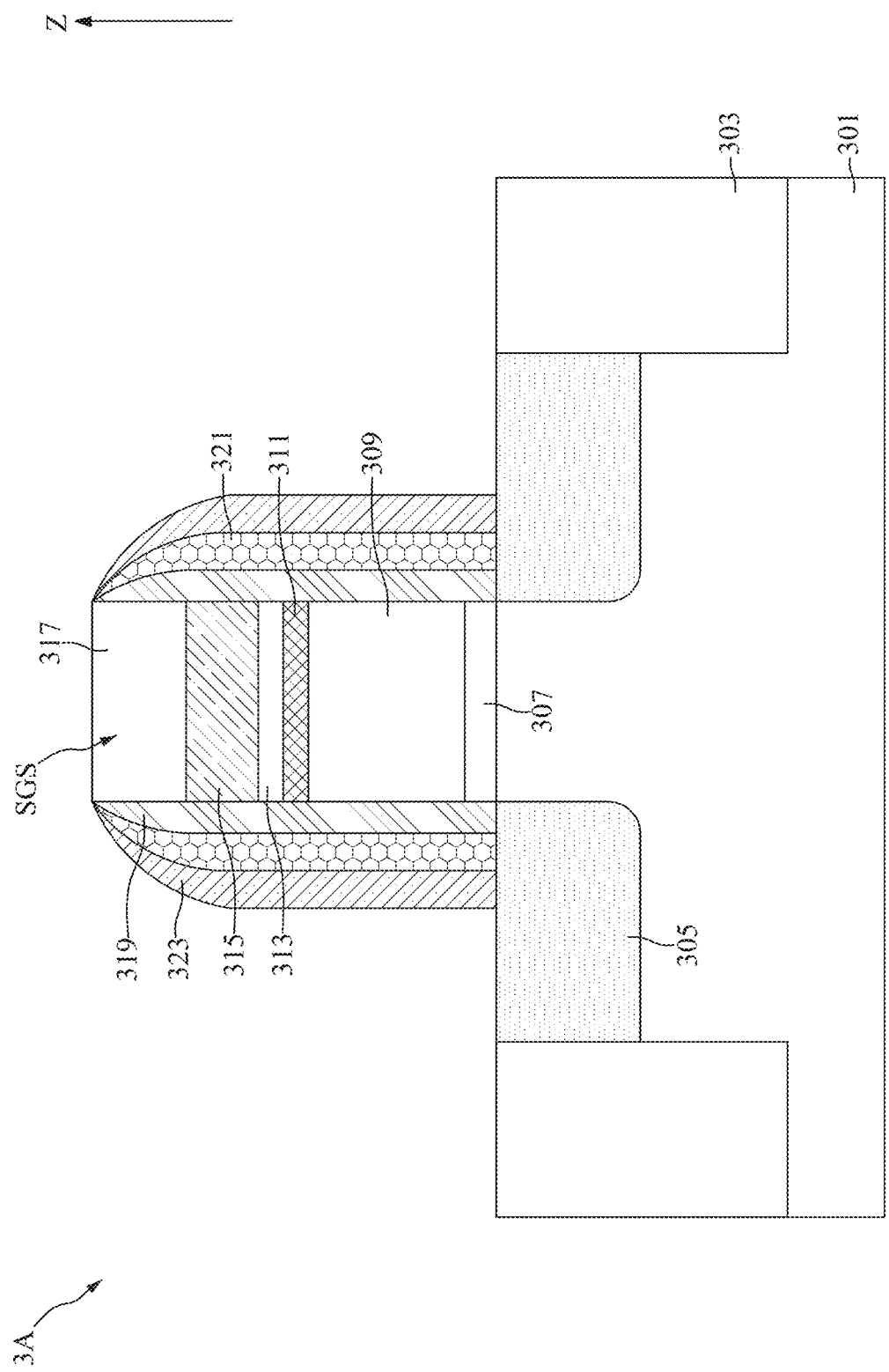
FIGS. 11 to 14 illustrate, in schematic cross-sectional view diagrams, semiconductor devices in accordance with some embodiments of the present disclosure.

FIG. 11 illustrates, in a schematic cross-sectional view diagram, a semiconductor device 3A in accordance with another embodiment of the present disclosure.

With reference to FIG. 11, the semiconductor device 3A may include a second substrate 301, second isolation layers 303, second source/drain regions 305, a dielectric layer 307, a bottom conductive layer 309, a first middle conductive layer 311, a second middle conductive layer 313, a top conductive layer 315, a capping layer 317, first spacers 319, porous spacers 321, and second spacers 323.

With reference to FIG. 11, the second substrate 301 may be formed of a same material as the first substrate 101 but is not limited thereto. The second isolation layers 303 may be disposed in the second substrate 301 in a manner similar to that illustrated in FIG. 1. The second isolation layers 303 may be formed of a same material as the first isolation layers 103 but is not limited thereto.

With reference to FIG. 11, the dielectric layer 307 may be disposed on the second substrate 301. In a cross-sectional perspective, the dielectric layer 307 may be line shape. The dielectric layer 307 may be formed of a same material as the buried dielectric layer 107 but is not limited thereto.

With reference to FIG. 11, the second source/drain regions 305 may be disposed adjacent to two ends of the dielectric layer 307 and disposed in the second substrate 301. The second source/drain regions 305 may be doped with a dopant such as phosphorus, arsenic, antimony, or boron. The dopant concentration of the second source/drain regions 305 may have a same dopant concentration as the first source/drain regions 105 but are not limited thereto.

With reference to FIG. 11, the bottom conductive layer 309 may be disposed on the dielectric layer 307. The bottom conductive layer 309 may be formed of, for example, a conductive material such as polycrystalline silicon, polycrystalline silicon germanium, or a combination thereof. In some embodiments, the bottom conductive layer 309 may be doped with a dopant such as phosphorus, arsenic, antimony, or boron.

With reference to FIG. 11, the first middle conductive layer 311 may be disposed on the bottom conductive layer 309. The first middle conductive layer 311 may have a thickness between about 2 nm and about 20 nm. The first middle conductive layer 311 may be formed of, for example, titanium silicide, nickel silicide, nickel platinum silicide, tantalum silicide, or cobalt silicide. The first middle conductive layer 311 may serve as ohmic contact and reduce the resistance between the bottom conductive layer 309 and the top conductive layer 315.

With reference to FIG. 11, the second middle conductive layer 313 may be disposed on the first middle conductive layer 311. The second middle conductive layer 313 may be formed of, for example, tungsten nitride, titanium nitride, tantalum nitride, the like, or a combination thereof. The second middle conductive layer 313 may be structured to prevent subsequent deposition processes from degrading other layers of the semiconductor device 3A. For example, some metals from the top conductive layer 315 may tend to diffuse into silicon-containing layers (e.g. the bottom conductive layer 309) during deposition and even after fabrication has completed.

With reference to FIG. 11, the top conductive layer 315 may be disposed on the second middle conductive layer 313. The top conductive layer 315 may be formed of, for example, any suitable conductor including tungsten, aluminum, copper, titanium, silver, ruthenium, molybdenum, other suitable metals and alloys thereof.

With reference to FIG. 11, the capping layer 317 may be disposed on the top conductive layer 315. The capping layer 317 may be formed of a same material as the buried capping layer 115 but is not limited thereto.

The dielectric layer 307, the bottom conductive layer 309, the first middle conductive layer 311, the second middle conductive layer 313, the top conductive layer 315, and the capping layer 317 may together form a stacked gate structure SGS.

With reference to FIG. 11, the first spacers 319 may be attached on sidewalls of the stacked gate structure SGS. The first spacers 319 may be disposed on the second source/drain regions 305. In some embodiments, the first spacers 319 may be formed of, for example, graphene. In some embodiments, the first spacers 319 may be formed of, for example, graphene, graphite, or the like. In some embodiments, the first spacers 319 may be formed of, for example, a material including $sp^2$ hybridized carbon atoms. In some embodiments, the first spacers 319 may be formed of, for example, a material including carbons having hexagonal crystal structures. The first spacers 319 formed of graphene may have low sheet resistance. Therefore, the conductivity of the semiconductor device 3A including the first spacers 319 may be improved.

With reference to FIG. 11, the porous spacers 321 may be attached on the sidewalls of the first spacers 319 and disposed on the second source/drain regions 305. The porous spacers 321 may have porosities between about 30% and about 90%. The porous spacers 321 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The plurality of empty spaces of the porous spacers 321 may be filled with air. As a result, a dielectric constant of the porous spacers 321 may be significantly lower than a layer formed of, for example, silicon oxide. Therefore, the porous spacers 321 may significantly reduce the parasitic capacitance of the semiconductor device 3A. That is, the porous spacers 321 may significantly alleviate an interference effect between electrical signals induced or applied to the semiconductor device 3A.

With reference to FIG. 11, the second spacers 323 may be attached on sidewalls of the porous spacers 321 and disposed on the second source/drain regions 305. The second spacers 323 may be formed of, for example, silicon nitride, silicon oxide, silicon oxynitride, silicon nitride oxide, the like, or a combination thereof. The second spacers 323 may electrically insulate the stacked gate structure SGS from adjacent conductive elements and provide protection to the porous spacers 321 and the first spacers 319.

Figure 12:
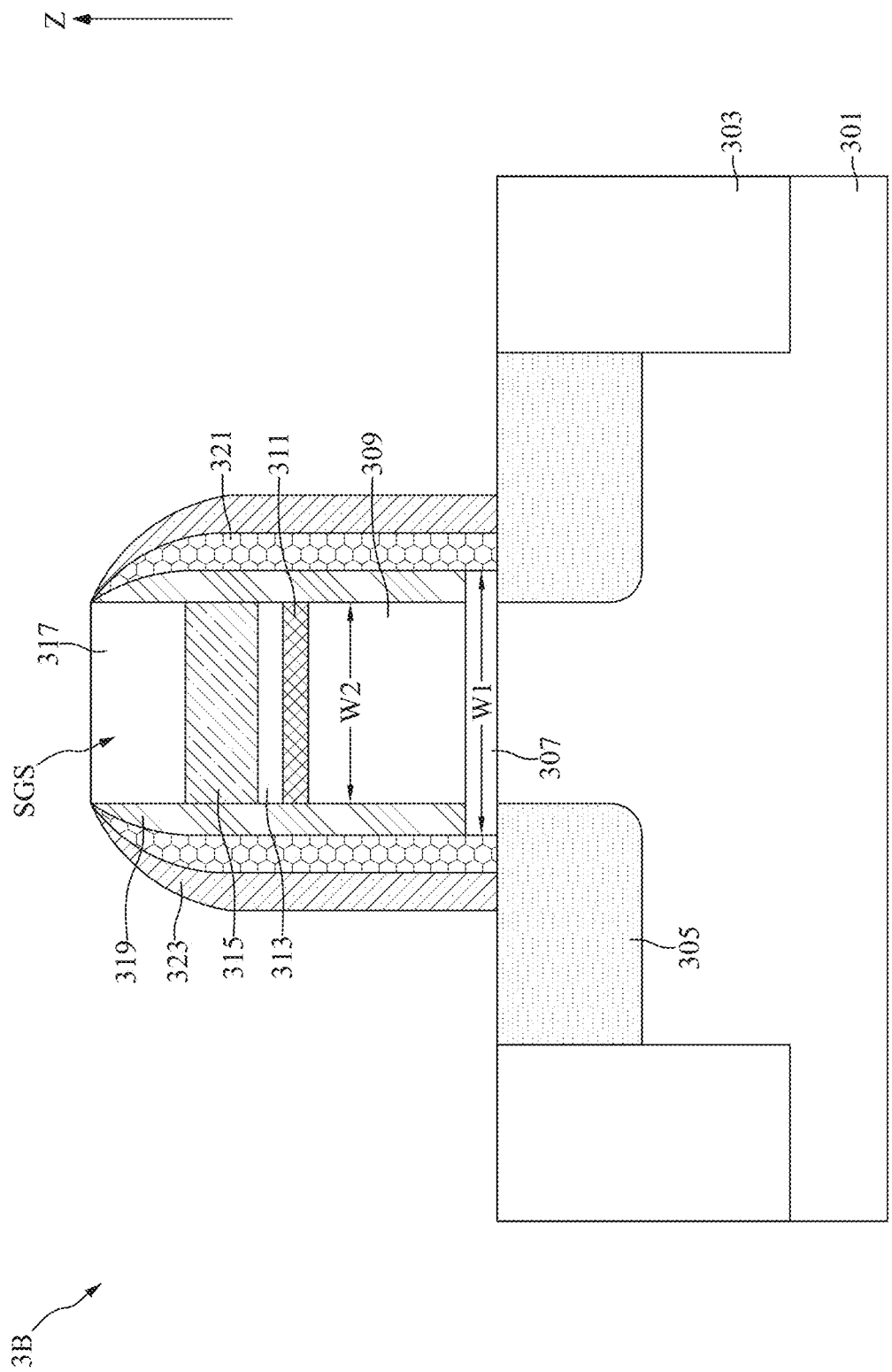
Figure 13:
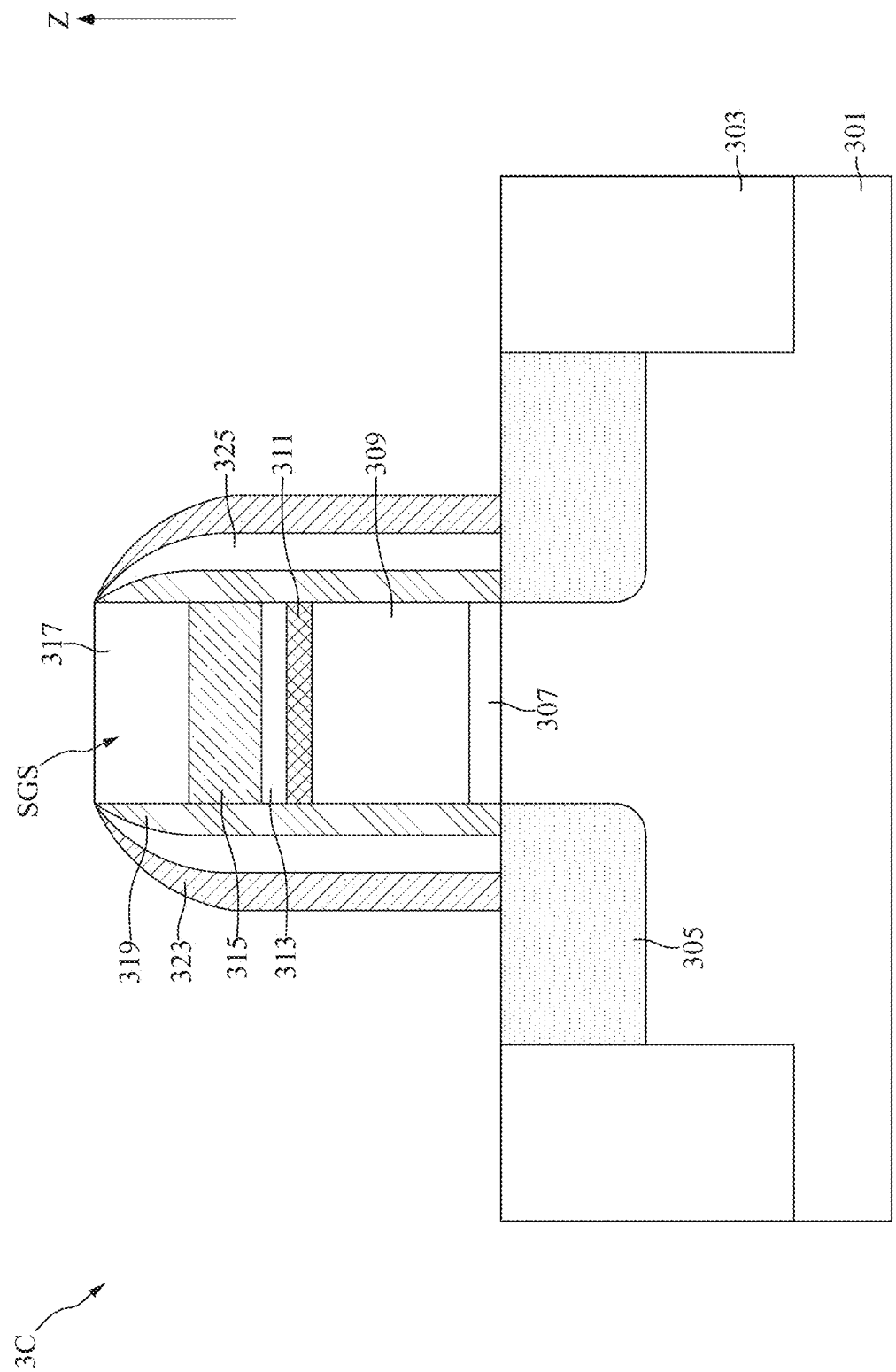
Figure 14:
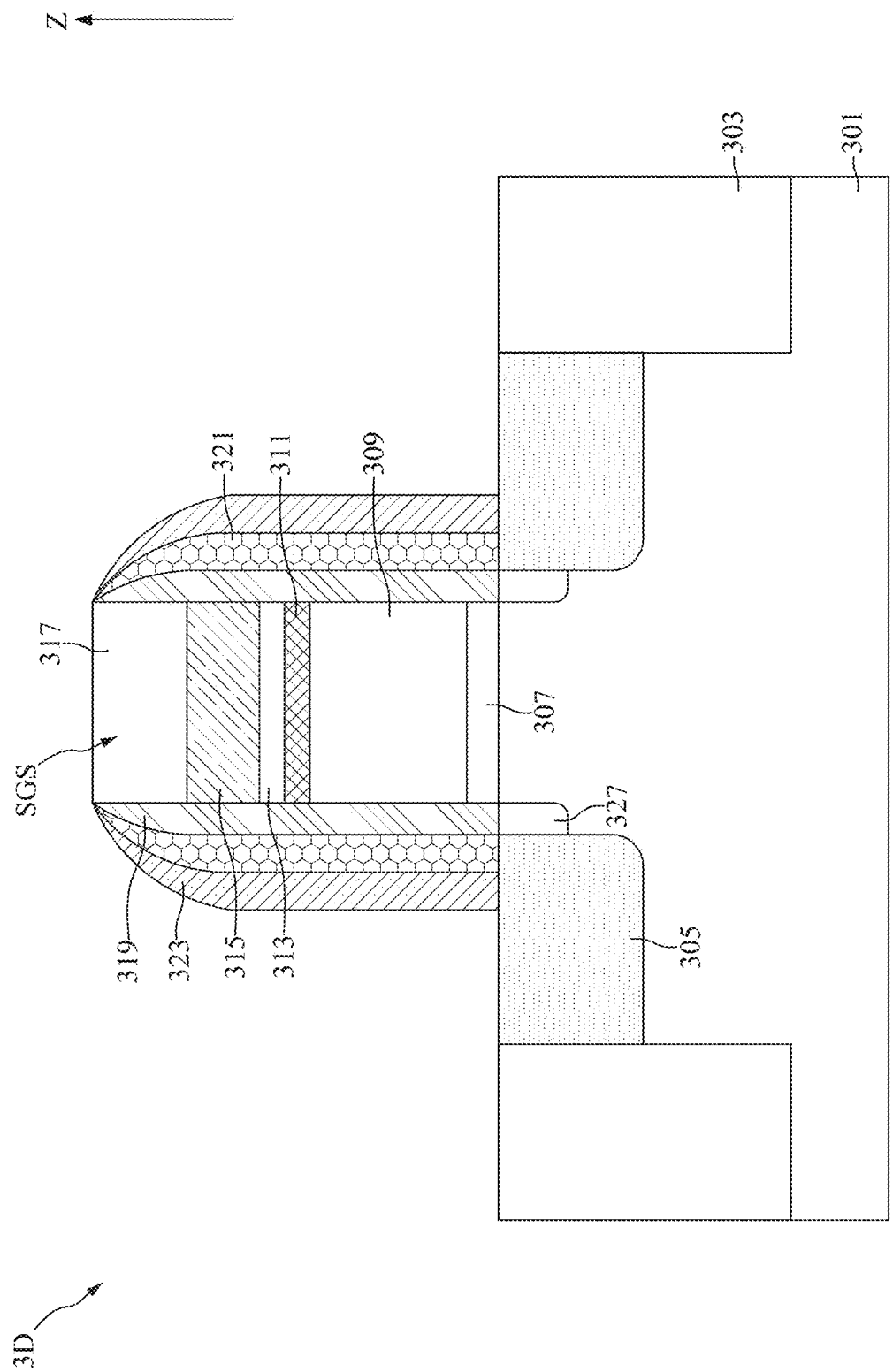

FIGS. 12 to 14 illustrate, in schematic cross-sectional view diagrams, semiconductor devices 3B, 3C, and 3D in accordance with some embodiments of the present disclosure.

With reference to FIG. 12, the semiconductor device 3B may have a structure similar to that illustrated in FIG. 11. The same or similar elements in FIG. 12 as in FIG. 11 have been marked with similar reference numbers and duplicative descriptions have been omitted.

With reference to FIG. 12, a width W1 of the dielectric layer 307 may be greater than a width W2 of the bottom conductive layer 309. The first spacers 319 may be disposed on the dielectric layer 307. The first spacers 319 may be electrically insulate from the second source/drain regions 305 by the dielectric layer 307.

With reference to FIG. 13, the semiconductor device 3C may have a structure similar to that illustrated in FIG. 11. The same or similar elements in FIG. 13 as in FIG. 11 have been marked with similar reference numbers and duplicative descriptions have been omitted.

With reference to FIG. 13, the porosities of the first spacers 319 may be 100% which means the first spacers 319 includes only empty spaces and the first spacers 319 may be regarded as air gaps 325. The dielectric constant of the air gaps 325 are 1.0 which may significantly reduce the parasitic capacitance between the stacked gate structure SGS and horizontally neighboring conductive elements.

With reference to FIG. 14, the semiconductor device 3D may have a structure similar to that illustrated in FIG. 11. The same or similar elements in FIG. 14 as in FIG. 11 have been marked with similar reference numbers and duplicative descriptions have been omitted.

With reference to FIG. 14, the semiconductor device 3D may include lightly doped regions 327. The lightly doped regions 327 may be respectively correspondingly disposed adjacent to the two ends of the dielectric layer 307 and in the second substrate 301. The first spacers 319 may be disposed on the lightly doped regions 327. The second source/drain regions 305 may be disposed adjacent to the lightly doped regions 327. The lightly doped regions 327 may be doped with a dopant such as phosphorus, arsenic, antimony, or boron. The dopant concentration of the lightly doped regions 327 may be less than the dopant concentration of the second source/drain regions 305. With the presence of the lightly doped regions 327, hot-carrier effect may be reduced.

Figure 15:
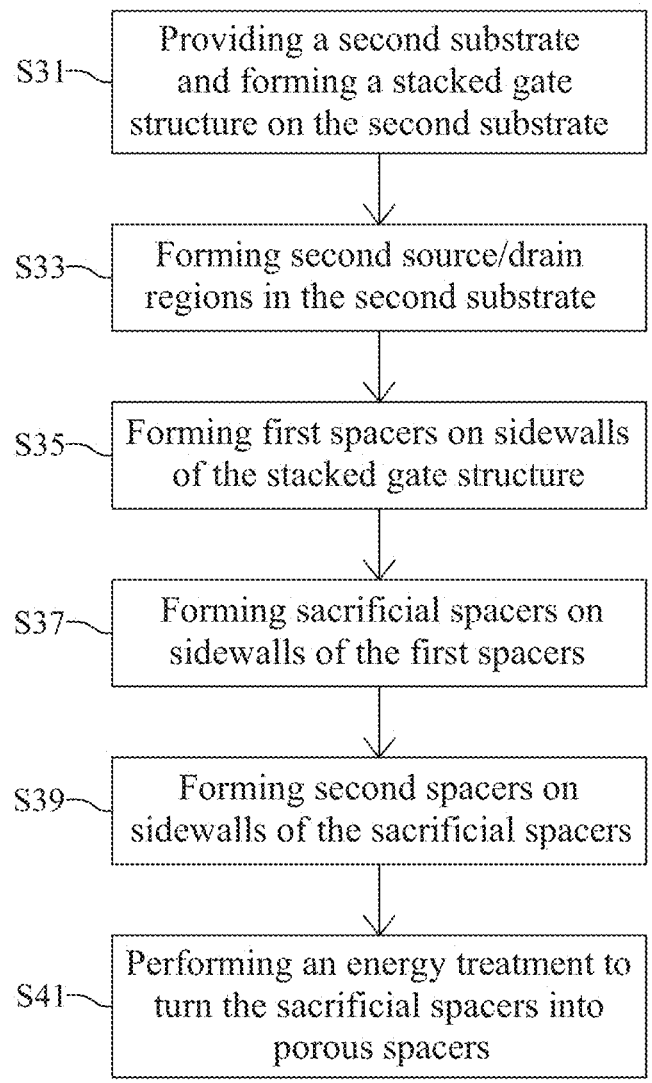
FIG. 15 illustrates, in a flowchart diagram form, a method for fabricating a semiconductor device in accordance with one embodiment of the present disclosure.

FIG. 15 illustrates, in a flowchart diagram form, a method 30 for fabricating a semiconductor device 3A in accordance with one embodiment of the present disclosure. FIGS. 16 to 25 illustrate, in schematic cross-sectional view diagrams, a flow for fabricating the semiconductor device 3A in accordance with one embodiment of the present disclosure.

With reference to FIG. 15 and FIGS. 16 to 19, at step S31, a second substrate 301 may be provided and a stacked gate structure SGS may be formed on the second substrate 301.

Figure 16:
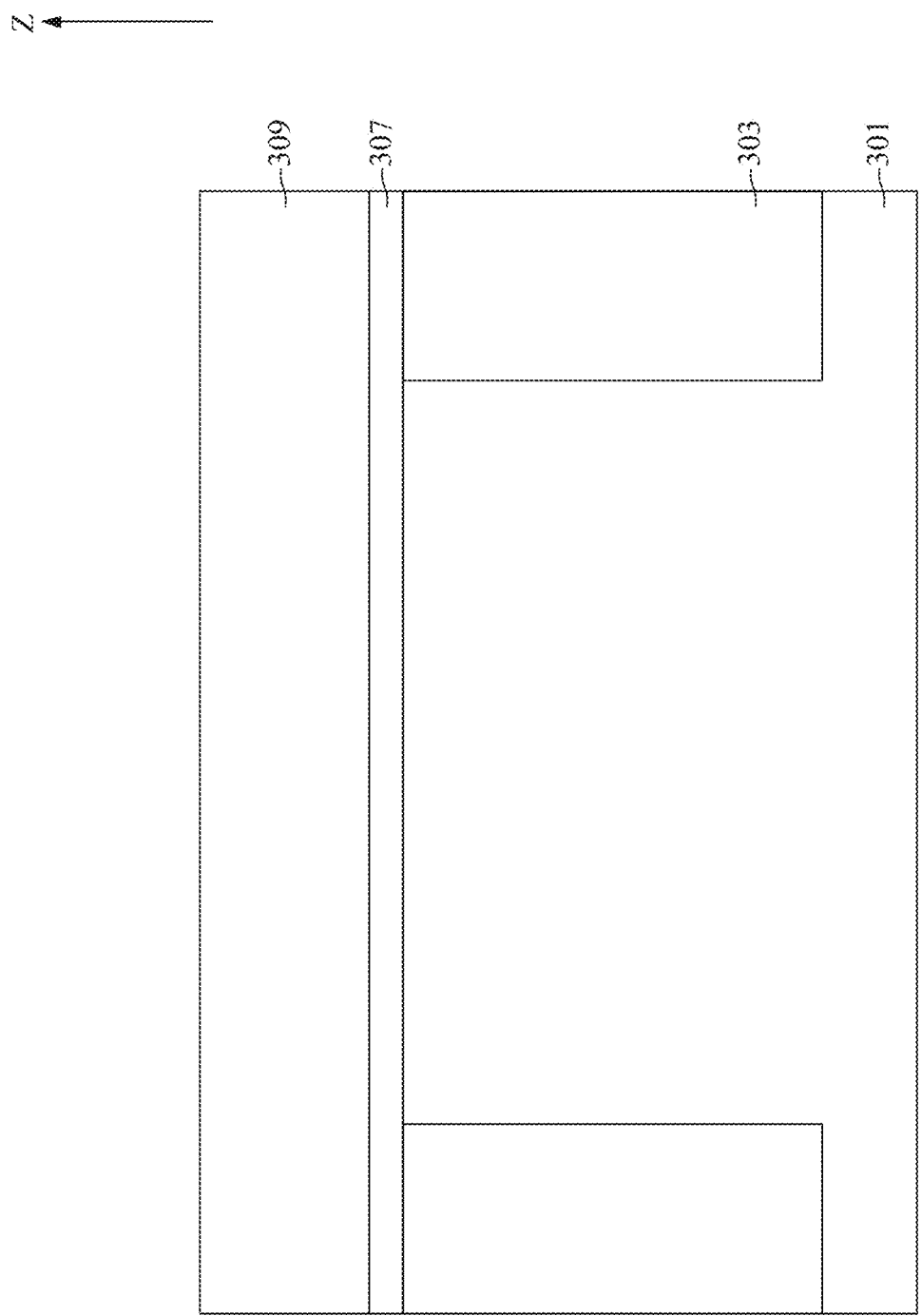
FIGS. 16 to 25 illustrate, in schematic cross-sectional view diagrams, a flow for fabricating the semiconductor device in accordance with one embodiment of the present disclosure.

With reference to FIG. 16, the second isolation layers 303 may be formed with a procedure similar to the first isolation layers 103 illustrated in FIG. 4. In some embodiments, the dielectric layer 307 may be formed on the second substrate 301 by a deposition process such as chemical vapor deposition or atomic layer deposition. In some embodiments, the dielectric layer 307 may be formed by oxidation. The bottom conductive layer 309 may be formed on the dielectric layer 307 by chemical vapor deposition or other suitable deposition process.

Figure 17:
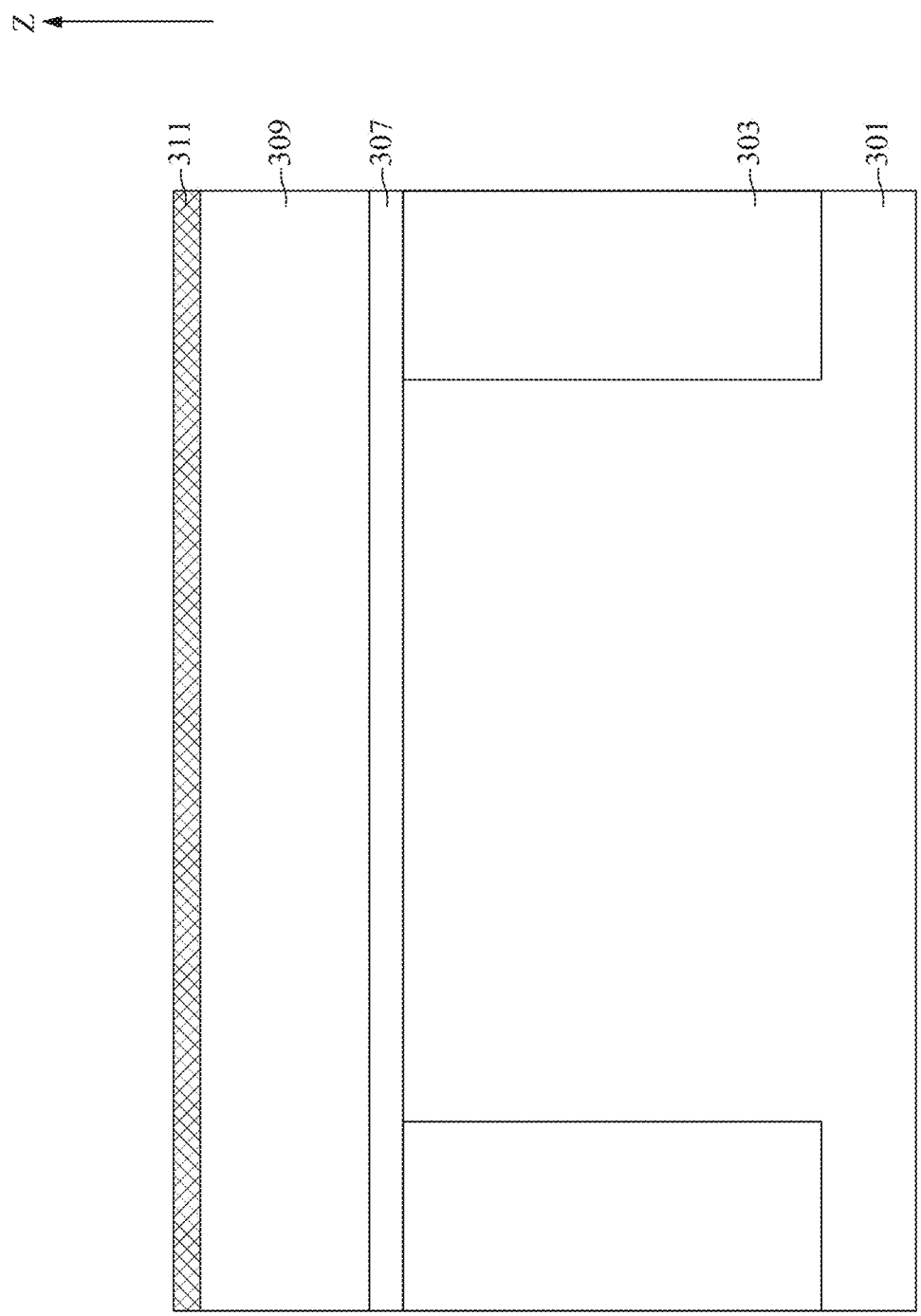

With reference to FIG. 17, a layer of conductive material may be formed over the intermediate semiconductor device illustrated in FIG. 16. The conductive material may include, for example, titanium, nickel, platinum, tantalum, or cobalt. A thermal treatment may be subsequently performed. During the thermal treatment, metal atoms of the layer of conductive material may react chemically with silicon atoms of the bottom conductive layer 309 to form the first middle conductive layer 311. The first middle conductive layer 311 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution.

Figure 18:
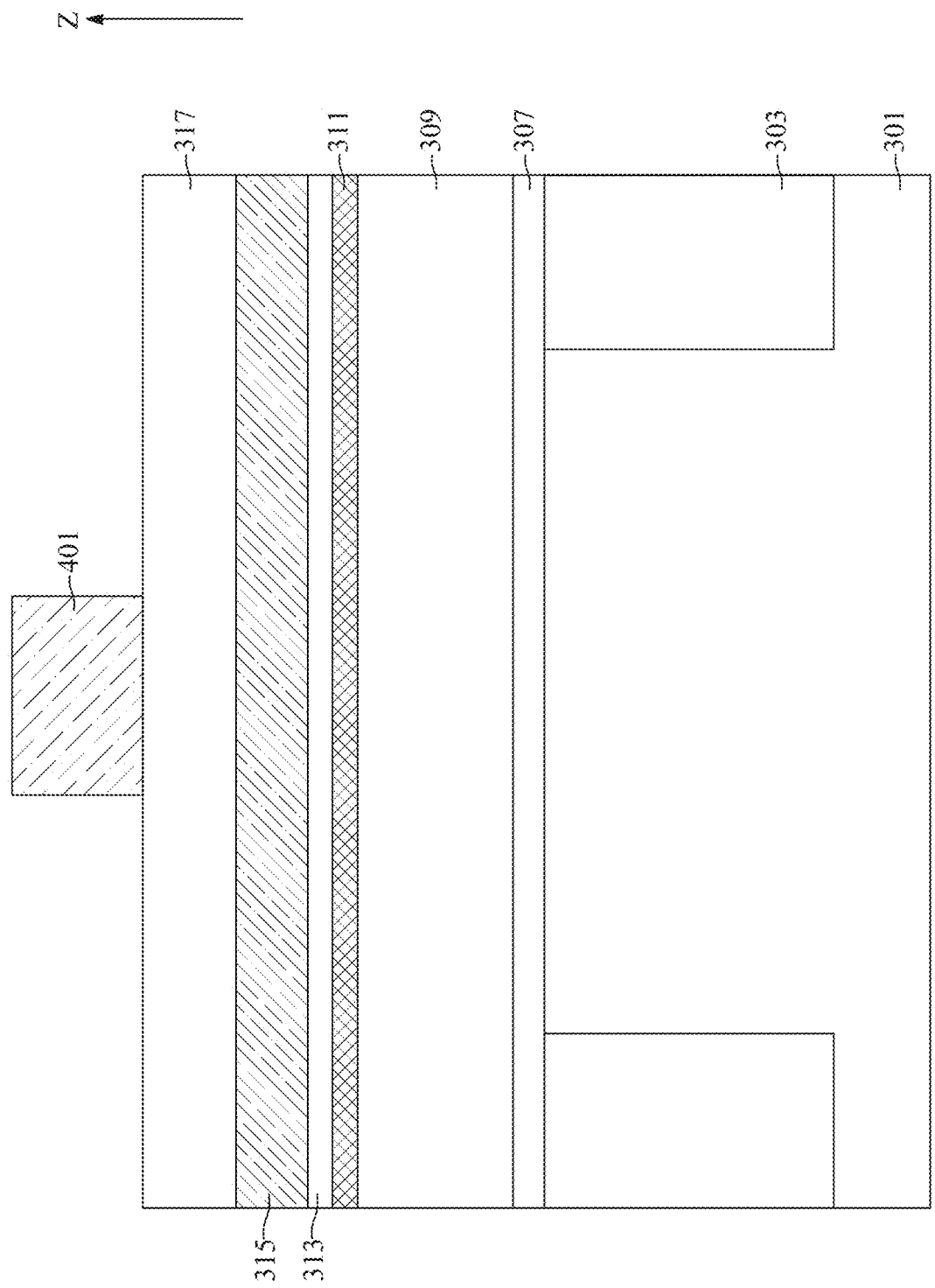

With reference to FIG. 18, a series of deposition processes may be performed to sequentially deposit the second middle conductive layer 313, the top conductive layer 315, the capping layer 317, and the first mask layer 401. The series of deposition processes may include chemical vapor deposition, plasma enhanced chemical vapor deposition, atomic layer deposition, physical vapor deposition, sputtering, or spin coating. The first mask layer 401 may be patterned to define the position of the stacked gate structure SGS.

Figure 19:
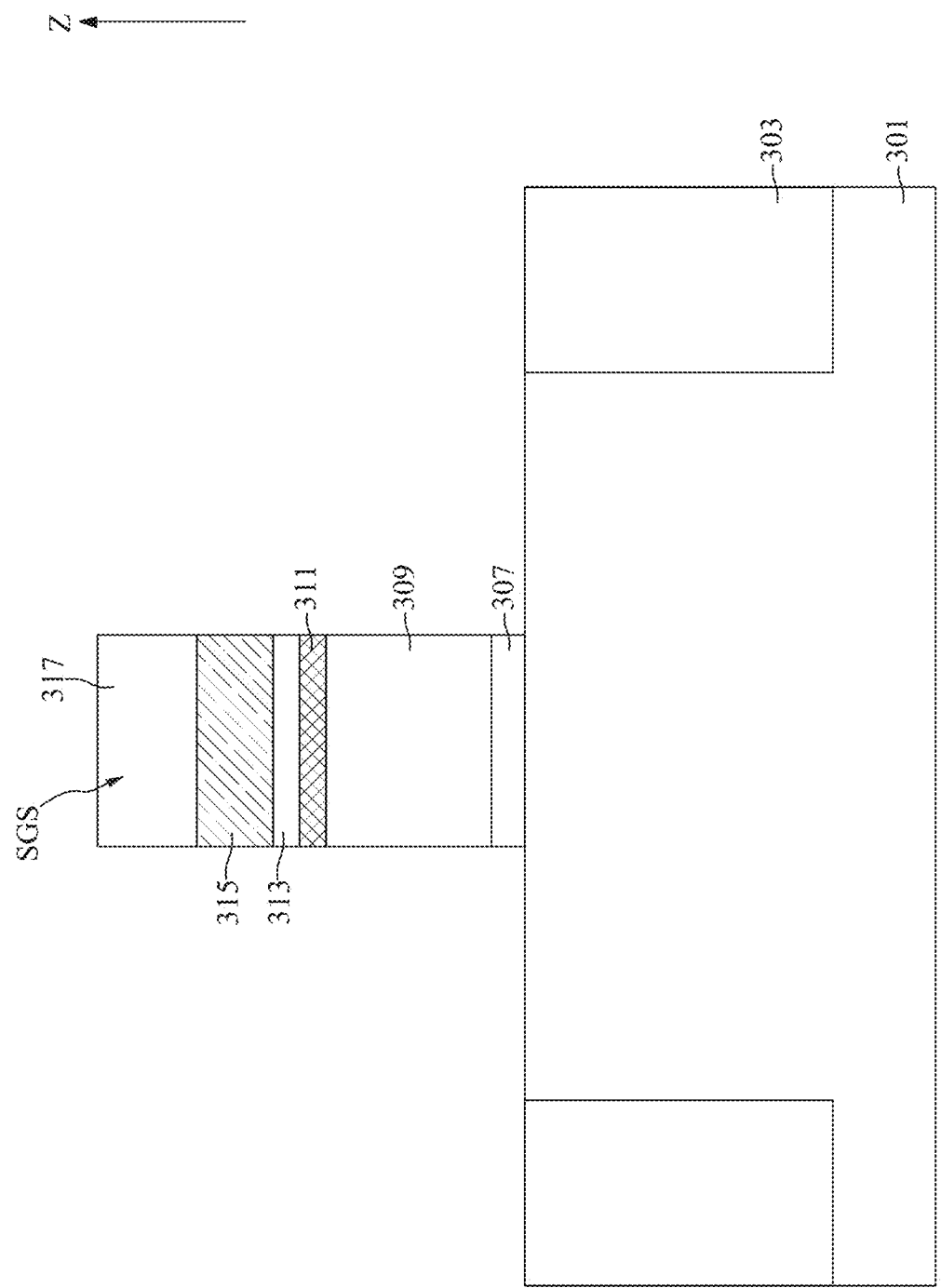

With reference to FIG. 19, an etch process may be performed to remove portions of the capping layer 317, the top conductive layer 315, the second middle conductive layer 313, the first middle conductive layer 311, the bottom conductive layer 309, and the dielectric layer 307. The remained portion of the capping layer 317, the top conductive layer 315, the second middle conductive layer 313, the first middle conductive layer 311, the bottom conductive layer 309, and the dielectric layer 307 together form the stacked gate structure SGS.

Figure 20:
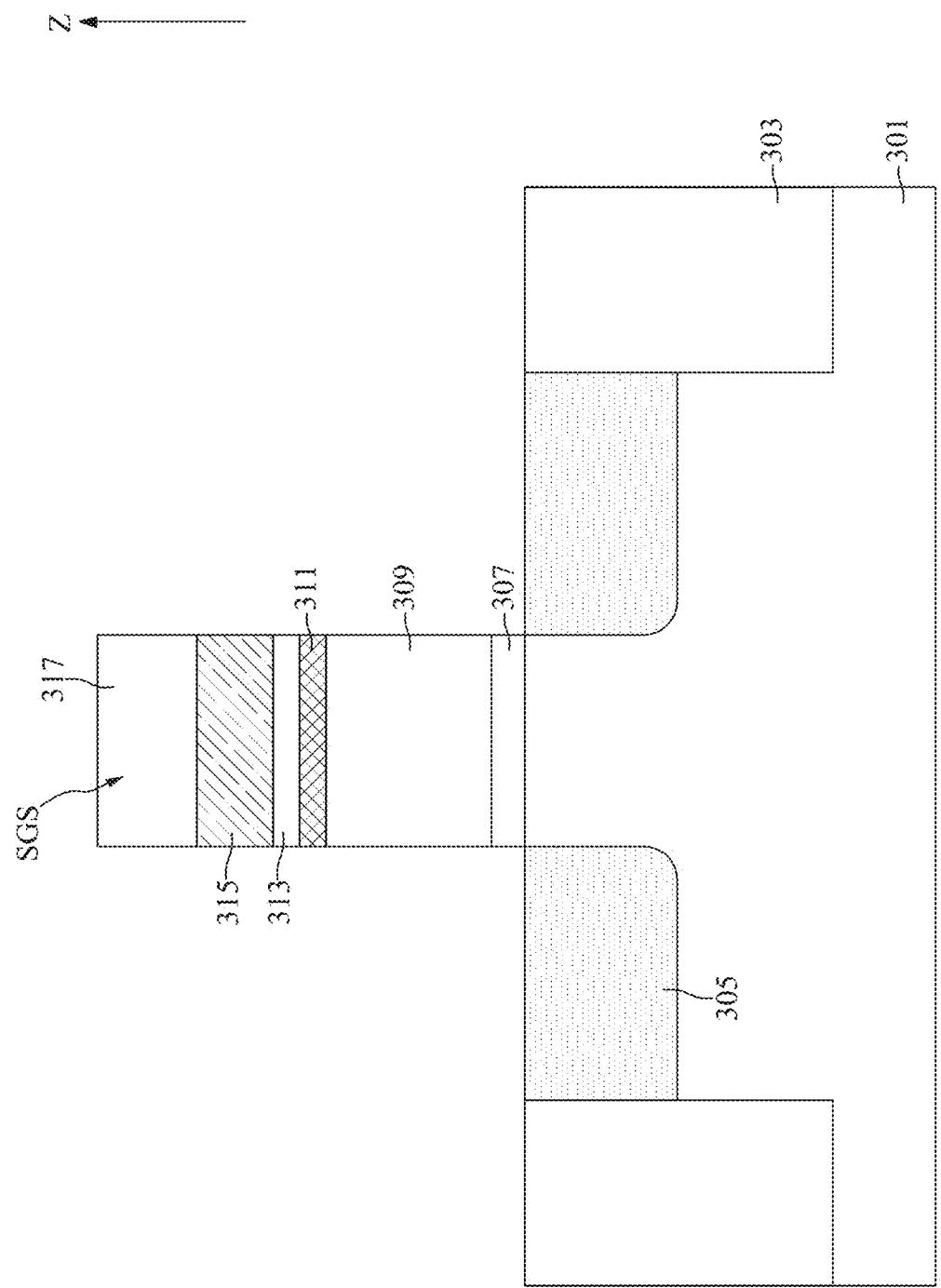

With reference to FIGS. 15 and 20, at step S33, second source/drain regions 305 may be formed in the second substrate 301.

With reference to FIG. 20, the second source/drain regions 305 may be formed adjacent to the stacked gate structure SGS and in the second substrate 301. The second source/drain regions 305 may be formed by a procedure similar to the first source/drain regions 105 illustrated in FIG. 4. An annealing process may be performed to activate the second source/drain regions 305. The annealing process may have a process temperature between about 800° C. and about 1250° C. the annealing process may have a process duration between about 1 millisecond and about 500 milliseconds. The annealing process may be, for example, a rapid thermal anneal, a laser spike anneal, or a flash lamp anneal.

Figure 21:
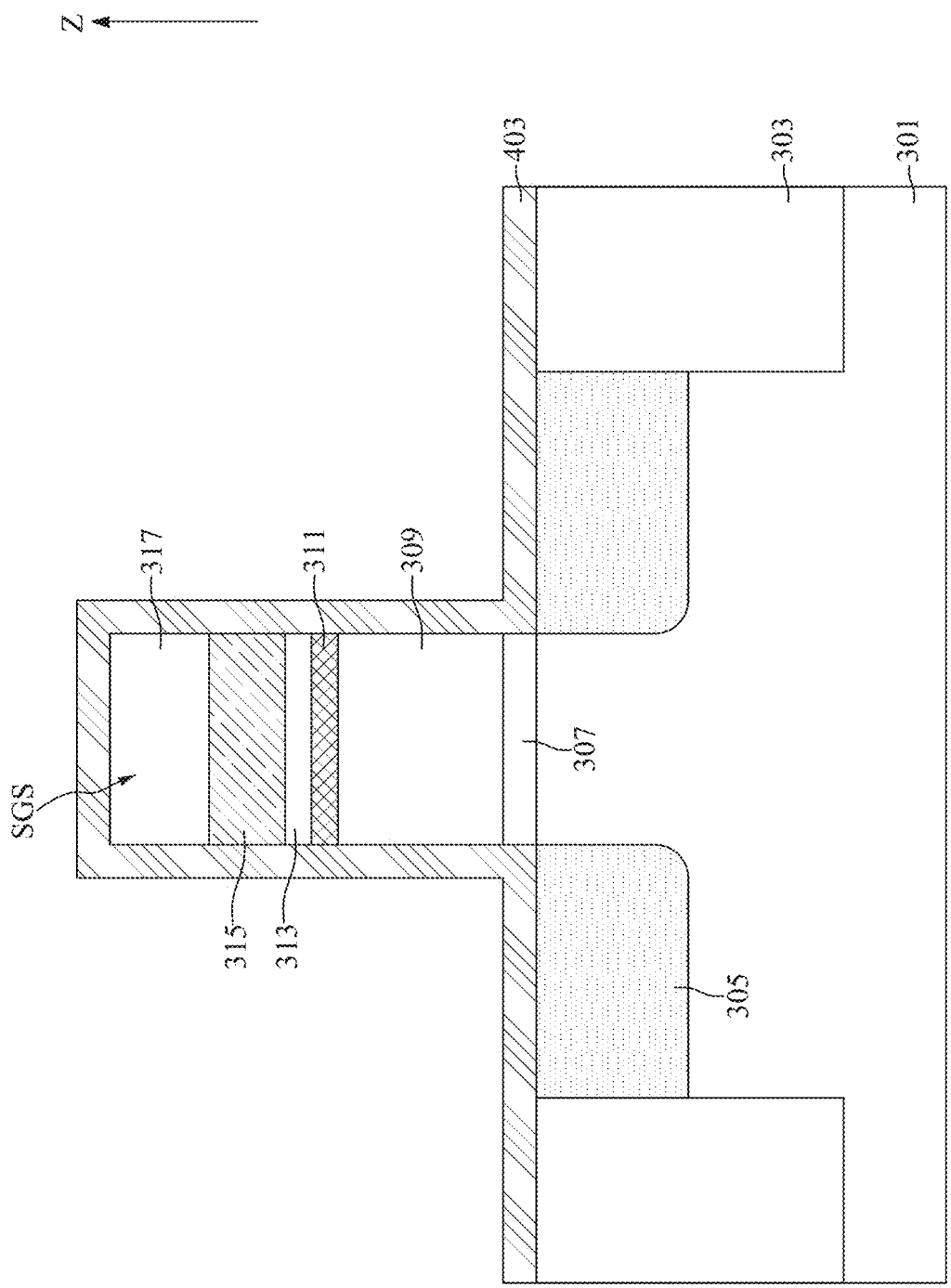
Figure 22:
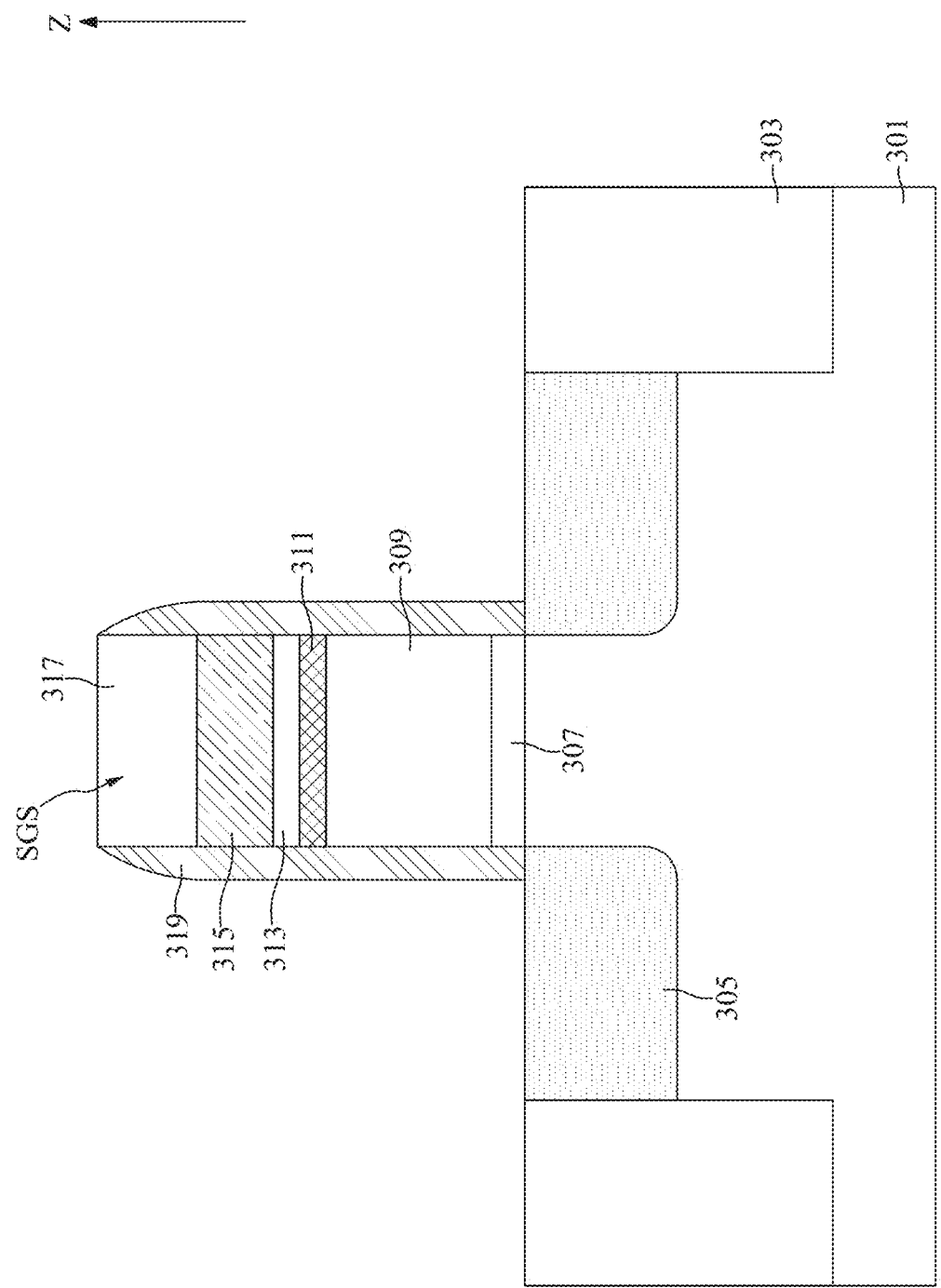

With reference to FIGS. 15, 21, and 22, at step S35, first spacers 319 may be formed on sidewalls of the stacked gate structure SGS.

With reference to FIG. 21, a layer of first conductive material 403 may be formed to cover the top surface of the second substrate 301 and the stacked gate structure SGS. In some embodiments, the layer of first conductive material 403 may be formed including, for example, graphene. In some embodiments, the layer of first conductive material 403 may be formed including, for example, graphene, graphite, or the like. In some embodiments, the layer of first conductive material 403 may be formed including, for example, a material including $sp^2$ hybridized carbon atoms. In some embodiments, the layer of first conductive material 403 may be formed including, for example, a material including carbons having hexagonal crystal structures.

In some embodiments, the layer of first conductive material 403 may be formed on a catalyst substrate and then transfer onto the intermediate semiconductor device illustrated in FIG. 20. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of first conductive material 403 may be formed with assistances of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

With reference to FIG. 22, an etch process, such as an anisotropic dry etch process, may be performed to remove portions of the layer of first conductive material 403 and concurrently form the first spacers 319.

Figure 23:
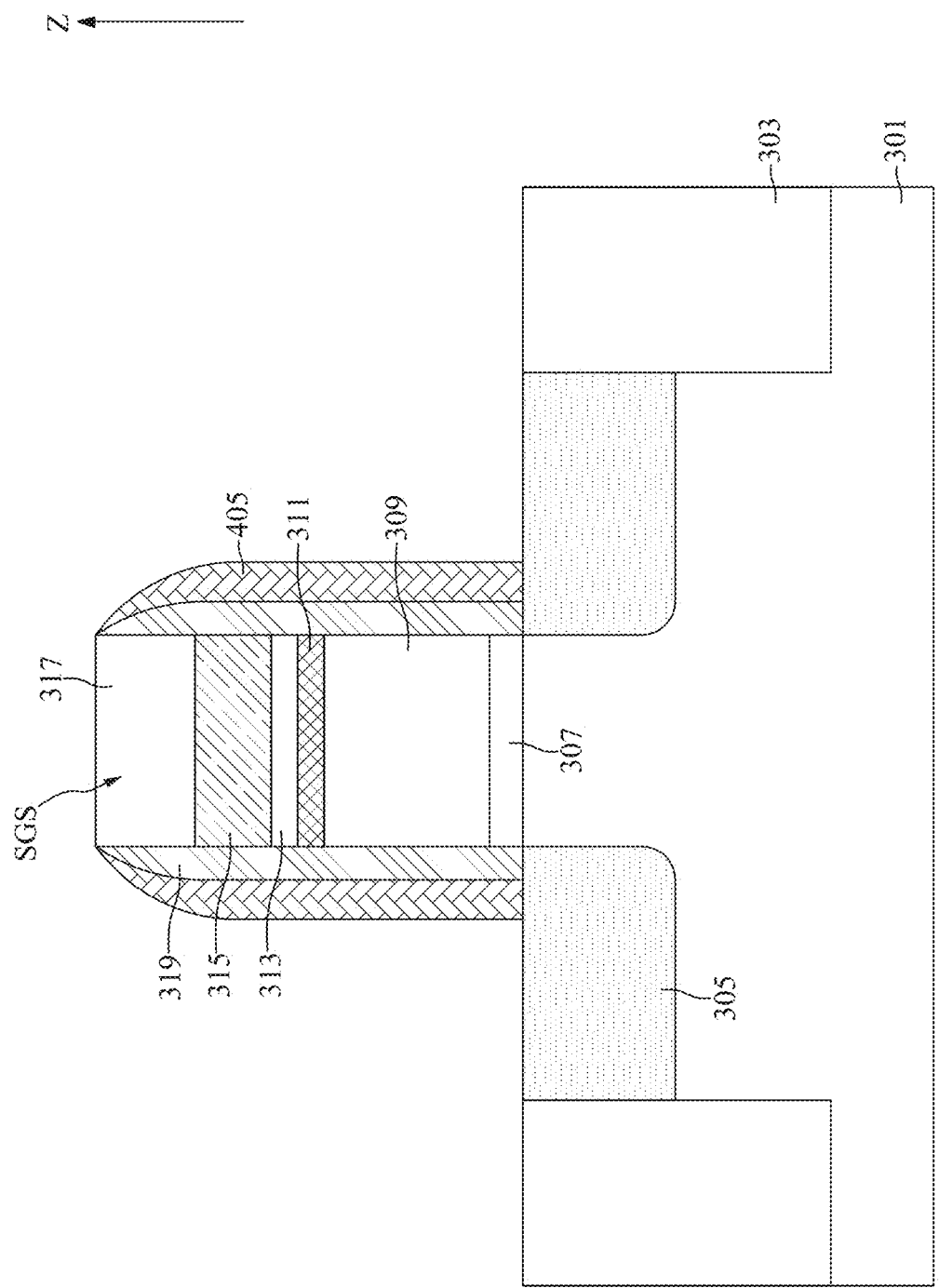

With reference to FIGS. 15 and 23, at step S37, sacrificial spacers 405 may be formed on sidewalls of the first spacers 319.

With reference to FIG. 23, a layer of energy-removable material may be formed over the intermediate semiconductor device illustrated in FIG. 22. The energy-removable material may include a material such as a thermal decomposable material, a photonic decomposable material, an e-beam decomposable material, or a combination thereof. For example, the energy-removable material may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material. An etch process, such as an anisotropic dry etch process, may be subsequently performed to remove portions of the layer of energy-removable material and concurrently form the sacrificial spacers 405.

Figure 24:
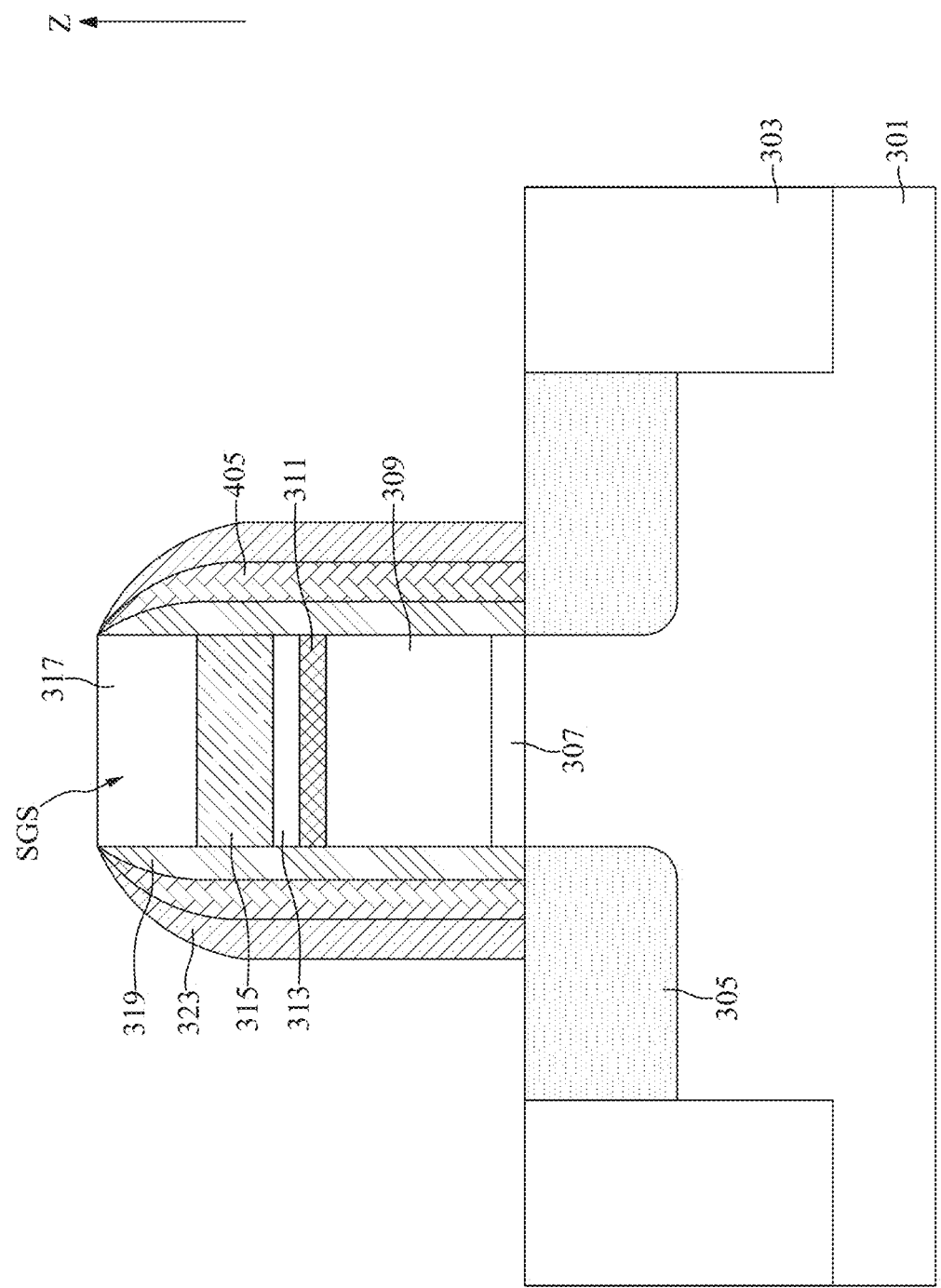

With reference to FIGS. 15 and 24, at step S39, second spacers 323 may be formed on sidewalls of the sacrificial spacers 405.

With reference to FIG. 24, a layer of insulating material may be formed over the intermediate semiconductor device illustrated in FIG. 23. The insulating material may be, for example, silicon nitride, silicon oxide, silicon oxynitride, silicon nitride oxide, the like, or a combination thereof. An etch process, such as an anisotropic dry etch process, may be subsequently performed to remove portions of the layer of insulating material and concurrently form the second spacers 323.

Figure 25:
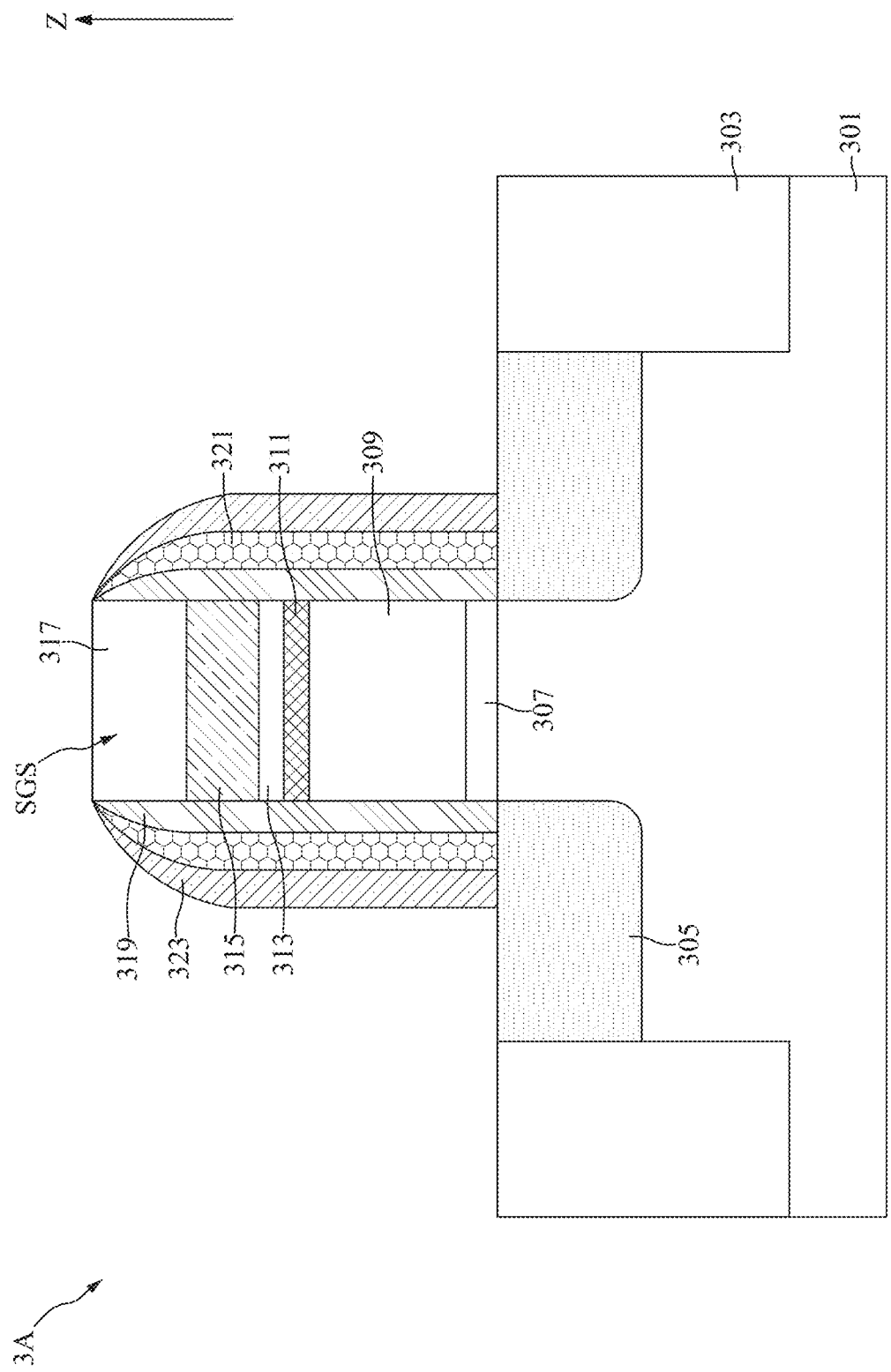

With reference to FIGS. 15 and 25, at step S41, an energy treatment may be performed to turn the sacrificial spacers 405 into porous spacers 321.

With reference to FIG. 25, an energy treatment may be performed to the intermediate semiconductor device illustrated in FIG. 24 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. After the energy treatment, the sacrificial spacers 405 may be turned into the porous spacers 321.

One aspect of the present disclosure provides a semiconductor device including a first substrate, a buried dielectric layer inwardly positioned in the first substrate, a buried conductive layer including a lower portion positioned on the buried dielectric layer and an upper portion positioned on the lower portion, a buried capping layer positioned on the upper portion, and buried covering layers positioned between the buried capping layer and the buried dielectric layer and between the upper portion of the buried conductive layer and the buried dielectric layer. The buried conductive layer includes graphene.

Another aspect of the present disclosure provides a semiconductor device including a second substrate, a stacked gate structure positioned on the second substrate, first spacers attached on two sides of the stacked gate structure, and second spacers attached on two sides of the first spacers. The first spacers are formed including graphene.

Another aspect of the present disclosure provides a method for fabricating a semiconductor device including providing a first substrate, forming a first trench in the first substrate, conformally forming a buried dielectric layer in the first trench, conformally forming buried covering layers to cover an upper portion of the first trench, forming a buried conductive layer on the buried dielectric layer, between the buried covering layers, and in the first trench, and forming a buried capping layer on the buried conductive layer. The buried conductive layer is formed including graphene.

Due to the design of the semiconductor device of the present disclosure, the overall cross-sectional area of the buried conductive layer 113 may be increased by the upper portion 113-3 of the buried conductive layer 113. Combining with the good conductivity of the buried conductive layer 113 including graphene, the conductivity and performance of the semiconductor device 1A may be improved. In addition, the presence of the buried covering layers 111 may prevent void formation during fabrication of the semiconductor device 1A. Therefore, the reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first substrate;
a buried dielectric layer inwardly positioned in the first substrate;
a buried conductive layer comprising a lower portion positioned on the buried dielectric layer and an upper portion positioned on the lower portion;
a buried capping layer positioned on the upper portion; and
buried covering layers positioned between the buried capping layer and the buried dielectric layer and between the upper portion of the buried conductive layer and the buried dielectric layer;
wherein the buried conductive layer comprises graphene; and
wherein thicknesses of the buried covering layers are gradually decreased toward to a bottom surface of the first substrate.

2. The semiconductor device of claim 1, further comprising first source/drain regions attached on two sides of the buried dielectric layer and positioned in the first substrate, wherein bottommost points of the buried covering layers are at a vertical level lower than a vertical level of bottom surfaces of the first source/drain regions.

3. The semiconductor device of claim 2, further comprising a buried barrier layer positioned between the buried covering layers and the buried dielectric layer and between the lower portion of the buried conductive layer and the buried dielectric layer.

4. The semiconductor device of claim 3, wherein the buried barrier layer is formed of titanium, titanium nitride, titanium silicon nitride, tantalum, tantalum nitride, tantalum silicon nitride, or combination thereof.

5. The semiconductor device of claim 4, wherein a thickness of the buried barrier layer is between about 10 angstroms and about 15 angstroms.

6. The semiconductor device of claim 1, wherein the buried covering layers are formed of aluminum oxide, hafnium oxide, zirconium oxide, titanium oxide, titanium nitride, tungsten nitride, silicon nitride, or silicon oxide.

7. The semiconductor device of claim 6, wherein a top surface of the buried conductive layer is at a vertical level higher than the vertical level of the bottom surfaces of the first source/drain regions.

8. The semiconductor device of claim 7, wherein the buried capping layer comprises a bottom layer positioned on the upper portion of the buried conductive layer and a top layer positioned on the bottom layer, and a top surface of the top layer is substantially coplanar with a top surface of the first substrate.

9. The semiconductor device of claim 8, wherein the bottom layer of the buried capping layer is formed of an insulating material having a dielectric constant of about 4.0 or greater and the top layer of the buried capping layer is formed of silicon oxide or fluoride-doped silicate.

10. A method for fabricating a semiconductor device, comprising:
providing a first substrate;
forming a first trench in the first substrate;
conformally forming a buried dielectric layer in the first trench;
conformally forming buried covering layers to cover an upper portion of the first trench;
forming a buried conductive layer on the buried dielectric layer, between the buried covering layers, and in the first trench; and
forming a buried capping layer on the buried conductive layer;
wherein the buried conductive layer comprises graphene;
wherein thicknesses of the buried covering layers are gradually decreased toward to a bottom surface of the first substrate.

11. The method for fabricating the semiconductor device of claim 10, further comprising a step of conformally forming a buried barrier layer on the buried dielectric layer and in the first trench.

12. The method for fabricating the semiconductor device of claim 11, further comprising a step of forming first source/drain regions on two sides of the buried dielectric layer and positioned in the first substrate, wherein bottom-most points of the buried covering layers are at a vertical level lower than a vertical level of bottom surfaces of the first source/drain regions.

13. The method for fabricating the semiconductor device of claim 12, wherein the buried barrier layer is formed between the buried covering layers and the buried dielectric layer and between the lower portion of the buried conductive layer and the buried dielectric layer.

14. The method for fabricating the semiconductor device of claim 13, wherein the buried barrier layer is formed of titanium, titanium nitride, titanium silicon nitride, tantalum, tantalum nitride, tantalum silicon nitride, or combination thereof.

15. The method for fabricating the semiconductor device of claim 14, wherein a thickness of the buried barrier layer is between about 10 angstroms and about 15 angstroms.

16. The method for fabricating the semiconductor device of claim 10, wherein the buried covering layers are formed of aluminum oxide, hafnium oxide, zirconium oxide, titanium oxide, titanium nitride, tungsten nitride, silicon nitride, or silicon oxide.

17. The method for fabricating the semiconductor device of claim 16, wherein a top surface of the buried conductive layer is at a vertical level higher than the vertical level of the bottom surfaces of the first source/drain regions.

18. The method for fabricating the semiconductor device of claim 17, wherein the buried capping layer comprises a bottom layer positioned on the upper portion of the buried conductive layer and a top layer positioned on the bottom layer, and a top surface of the top layer is substantially coplanar with a top surface of the first substrate.

* * * * *